United States Patent
Shin et al.

(10) Patent No.: US 10,692,896 B2
(45) Date of Patent: Jun. 23, 2020

(54) DISPLAY PANEL HAVING LIQUID CRYSTAL CAPACITOR AND SIGNAL LINES

(71) Applicant: Samsung Display Co., Ltd., Yongin-Si (KR)

(72) Inventors: Cheol Shin, Hwaseong-si (KR); Haksun Chang, Yongin-si (KR); Sehyun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/172,283

(22) Filed: Oct. 26, 2018

(65) Prior Publication Data

US 2019/0131320 A1    May 2, 2019

(30) Foreign Application Priority Data

Oct. 27, 2017   (KR) .................. 10-2017-0141547

(51) Int. Cl.

| | |
|---|---|
| *G02F 1/1343* | (2006.01) |
| *H01L 27/12* | (2006.01) |
| *G02F 1/1335* | (2006.01) |
| *G02F 1/1333* | (2006.01) |
| *G02F 1/1337* | (2006.01) |
| *G02F 1/1362* | (2006.01) |

(52) U.S. Cl.
CPC ...... *H01L 27/124* (2013.01); *G02F 1/133345* (2013.01); *G02F 1/133512* (2013.01); *G02F 1/133514* (2013.01); *G02F 1/133753* (2013.01); *G02F 1/134336* (2013.01); *G02F 1/136286* (2013.01); *G02F 2201/121* (2013.01); *G02F 2201/123* (2013.01)

(58) Field of Classification Search
CPC ................................................. G02F 1/134309
See application file for complete search history.

(56) References Cited

U.S. PATENT DOCUMENTS

| | | | |
|---|---|---|---|
| 8,035,787 B2 | 10/2011 | Jung et al. | |
| 8,865,274 B2 | 10/2014 | Choi et al. | |
| 2013/0057813 A1* | 3/2013 | Jeong | G02F 1/134309 349/110 |
| 2015/0036073 A1 | 2/2015 | Im et al. | |

(Continued)

FOREIGN PATENT DOCUMENTS

| | | |
|---|---|---|
| KR | 10-2011-0111227 | 10/2011 |
| KR | 10-2015-0016014 | 2/2015 |

*Primary Examiner* — Roy P Rabindranath
(74) *Attorney, Agent, or Firm* — H.C. Park & Associates, PLC

(57) ABSTRACT

A display panel may include a first signal line extending in a first direction, a second signal line extending in the first direction and being spaced apart from the first signal line when viewed in a plan view, a first thin-film transistor connected to the first signal line, a second thin-film transistor connected to the second signal line, and a first liquid crystal capacitor and a second liquid crystal capacitor respectively connected to the first thin-film transistor and the second thin-film transistor and arranged in the first direction. Each of the first signal line and the second signal line may overlap the pixel electrode of the first liquid crystal capacitor, when viewed in a plan view, and may be disposed to be closer to the vertical portion than to an outer edge of the pixel electrode.

20 Claims, 23 Drawing Sheets

(56) References Cited

U.S. PATENT DOCUMENTS

| | | | |
|---|---|---|---|
| 2016/0104722 A1* | 4/2016 | Woo | H01L 27/124 257/72 |
| 2016/0116806 A1 | 4/2016 | Shin et al. | |
| 2017/0219877 A1* | 8/2017 | Hwang | G02F 1/1362 |
| 2017/0242306 A1 | 8/2017 | Chang et al. | |

* cited by examiner

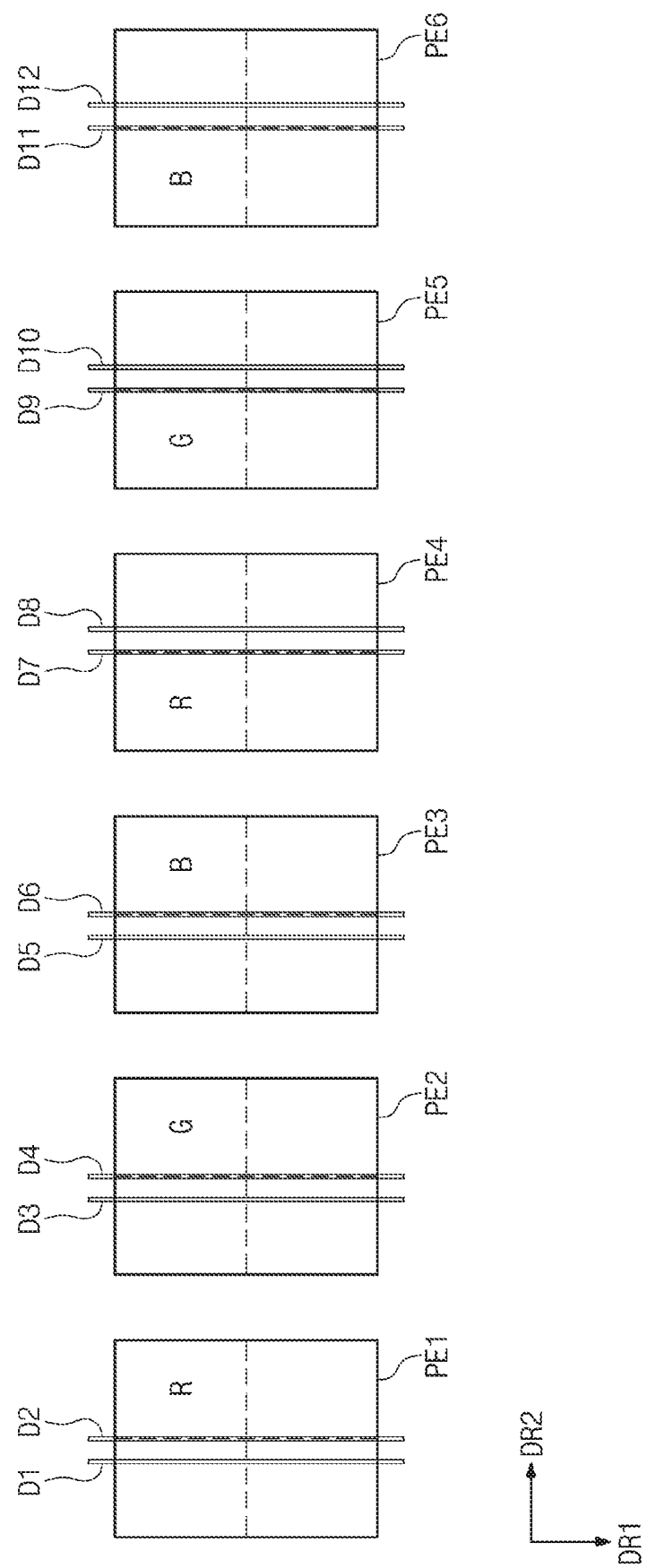

DISPLAY PANEL HAVING LIQUID CRYSTAL CAPACITOR AND SIGNAL LINES

CROSS-REFERENCE TO RELATED APPLICATION

This application claims priority from and the benefit of Korean Patent Application No. 10-2017-0141547, filed Oct. 27, 2017, which is hereby incorporated by reference for all purposes as if fully set forth herein.

BACKGROUND

Field

Exemplary embodiments generally relate to a display panel, and more specifically, to a liquid crystal display panel.

Discussion

A liquid crystal display device is a type of flat-panel display device, and typically includes a liquid crystal display panel having two opposite substrates and a liquid crystal layer interposed therebetween. If a voltage is applied to an electrode of the liquid crystal display device, an electric field, which is exerted to the liquid crystal layer, is produced, and this electric field is used to control an alignment direction of liquid crystal molecules of the liquid crystal layer and polarization of incident light. This process is used to display an image via the liquid crystal display device.

A vertically-aligned mode liquid crystal display device is a type of liquid crystal display device. When no electric field is applied thereto, liquid crystal molecules of the vertically-aligned mode liquid crystal display device are aligned to have a longitudinal axis perpendicular to a display plate, e.g., substrate. The vertically-aligned mode liquid crystal display device enables manufacturers to easily realize a relatively high contrast ratio and a relatively wide viewing angle.

In a liquid crystal display device, a plurality of domains having different liquid crystal alignment directions may be formed in each pixel. Liquid crystal molecules in each domain are aligned to have substantially the same direction.

The above information disclosed in this section is only for understanding the background of the inventive concepts, and, therefore, may contain information that does not form prior art.

SUMMARY

Some exemplary embodiments are capable of providing a display panel having a wide viewing angle and improved lateral visibility.

Some exemplary embodiments are capable of providing a high resolution display panel.

Additional aspects will be set forth in the detailed description which follows, and, in part, will be apparent from the disclosure, or may be learned by practice of the inventive concepts.

According to some exemplary embodiments, a display panel includes: a first signal line extending in a first direction; a second signal line extending in the first direction and spaced apart from the first signal line when viewed in a plan view; a third signal line insulated from and crossing the first signal line and the second signal line, the third signal line extending in a second direction crossing the first direction; a first thin-film transistor connected to the first signal line; a second thin-film transistor connected to the second signal line; and a first liquid crystal capacitor and a second liquid crystal capacitor arranged in the first direction and respectively connected to the first thin-film transistor and the second thin-film transistor. Each of the first liquid crystal capacitor and the second liquid crystal capacitor includes a pixel electrode, a common electrode, and a liquid crystal layer. Each of the pixel electrodes of the first liquid crystal capacitor and the second liquid crystal capacitor includes: a vertical portion extending in the first direction; a horizontal portion connected to the vertical portion, the horizontal portion extending in the second direction; and a plurality of branch portions, each of which is connected to the horizontal portion or the vertical portion, the plurality of branch portions extending in a direction crossing the horizontal portion and the vertical portion. Each of the first signal line and the second signal line overlaps, when viewed in a plan view, the pixel electrode of the first liquid crystal capacitor and is disposed closer to the vertical portion than to an outer edge of the pixel electrode of the first liquid crystal capacitor in the second direction.

In some exemplary embodiments, the horizontal portion may include one end and an opposite end. The first signal line and the second signal line may be disposed within a region defined between a first midpoint and a second midpoint, the first midpoint being between the one end of the horizontal portion and the vertical portion, the second midpoint being between the opposite end of the horizontal portion and the vertical portion.

In some exemplary embodiments, when viewed in a plan view, at least one of the first signal line and the second signal line may overlap the horizontal portion.

In some exemplary embodiments, the first signal line and second signal line may be spaced apart from each other in the first direction. The horizontal portion may be interposed between the first signal line and the second signal line.

In some exemplary embodiments, the display panel may further include a light-blocking pattern overlapping the horizontal portion and extending in the first direction. The light-blocking pattern may be spaced apart from each of the first signal line and the second signal line in the second direction.

In some exemplary embodiments, the vertical portion may be connected to the horizontal portion and may cross a midpoint of the horizontal portion.

In some exemplary embodiments, the vertical portion may be spaced apart from a midpoint of the horizontal portion in the second direction. When viewed in a plan view, at least one of the first signal line and the second signal line may overlap the vertical portion.

In some exemplary embodiments, the vertical portion may include a first portion and a second portion that are divided by the horizontal portion. The first portion and the second portion may be spaced apart from each other in the second direction.

In some exemplary embodiments, the first signal line may overlap one of the first portion and the second portion. The second signal line may overlap the other of the first portion and the second portion.

In some exemplary embodiments, one of the first signal line and the second signal line may extend along each of the first portion, a horizontal portion connecting the first portion to the second portion, and the second portion. When viewed in a plan view, the other of the first signal line and the second signal line may be spaced apart from the vertical portion.

In some exemplary embodiments, each of the pixel electrodes of the first liquid crystal capacitor and the second liquid crystal capacitor may further include: a first edge portion connected to one end of the horizontal portion, the first edge portion extending in the first direction; and a second edge portion connected to an opposite end of the horizontal portion, the second edge portion extending in the first direction. When viewed in a plan view, each of the first signal line and the second signal line may be spaced apart from the first edge portion and the second edge portion.

In some exemplary embodiments, when viewed in a plan view, the vertical portions of the pixel electrodes of the first liquid crystal capacitor and the second liquid crystal capacitor may not overlap each other in the first direction.

In some exemplary embodiments, each of the first signal line and the second signal line may further include a portion extending in the second direction.

In some exemplary embodiments, the first thin-film transistor and the second thin-film transistor may be disposed between the first signal line and the second signal line.

In some exemplary embodiments, the display panel may further include a fourth signal line spaced apart from the third signal line when viewed in a plan view, the fourth signal line and the third signal line extending in the second direction and crossing the first signal line and the second signal line, the fourth signal line and the third signal line being electrically disconnected from the first signal line and the second signal line. The first thin-film transistor may be connected to the third signal line. The second thin-film transistor may be connected to the fourth signal line.

In some exemplary embodiments, the first thin-film transistor and the second thin-film transistor may be connected to the third signal line.

According to some exemplary embodiments, a display panel includes: a first signal line and a second signal line that extend in a first direction and are spaced apart from each other in a second direction crossing the first direction; a third signal and a fourth signal line that extend in the second direction and cross the first signal line and the second signal line, the third signal line and the fourth signal line being insulated from the first signal line and the second signal line; a first thin-film transistor connected to the first signal line and the third signal line; a second thin-film transistor connected to the second signal line and the fourth signal line; a first pixel electrode connected to the first thin-film transistor, the first pixel electrode overlapping, when viewed in a plan view, the first signal line and the second signal line; and a second pixel electrode connected to the second thin-film transistor, the second pixel electrode overlapping, when viewed in a plan view, the first signal line and the second signal line. Each of the first pixel electrode and the second pixel electrode includes: a vertical portion extending in the first direction; a horizontal portion extending in the second direction and connected to the vertical portion; and a plurality of branch portions, each of which is connected to the vertical portion or the horizontal portion, the plurality of branch portions extending in a direction crossing the first direction and the second direction. When viewed in the plan view, at least one of the first signal line and the second signal line overlaps the vertical portion.

In some exemplary embodiments, the horizontal portion may include one end and an opposite end spaced apart from each other in the second direction. The first signal line and the second signal line may be disposed between two midpoints, a first midpoint of the midpoints being disposed between the vertical portion and the one end of the horizontal portion, and a second midpoint of the midpoints being disposed between the vertical portion and the opposite end of the horizontal portion.

In some exemplary embodiments, the vertical portion may include a first portion and a second portion spaced apart from each other in the second direction, the horizontal portion being interposed between the first portion and the second portion. One of the first signal line and the second signal line may overlap the first portion. The other of the first signal line and the second signal line may overlap the second portion.

In some exemplary embodiments, the vertical portion may include a first portion and a second portion arranged in the first direction, the horizontal portion being interposed between the first portion and the second portion. One of the first signal line and the second signal line may overlap the first portion and the second portion. The other of the first signal line and the second signal line may be spaced apart from the vertical portion in the second direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 9A, 9B, and 9C are plan views illustrating a portion of a display panel according to some exemplary embodiments.

DETAILED DESCRIPTION OF THE ILLUSTRATED EMBODIMENTS

Figure 1A:
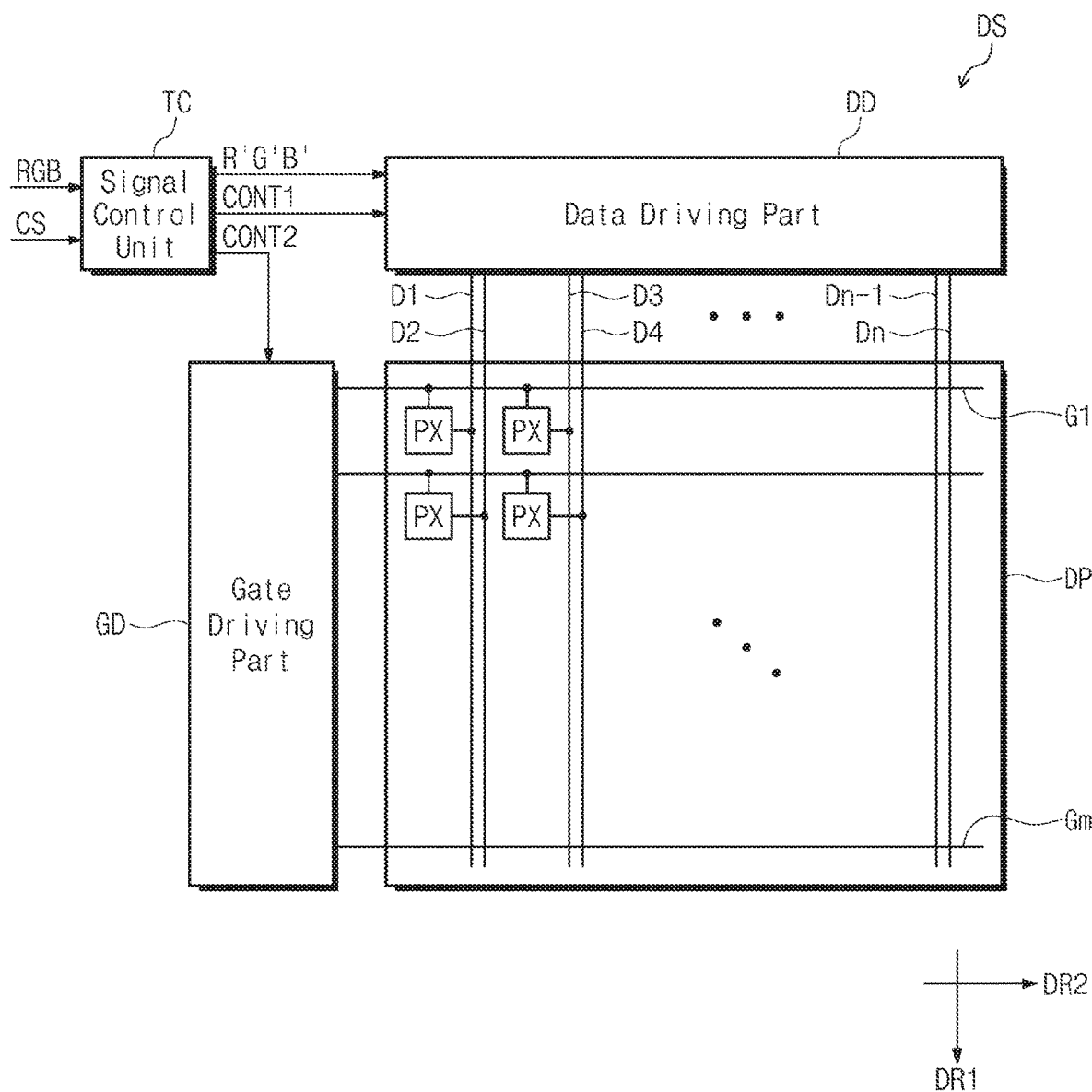
FIG. 1A is a block diagram schematically illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 1B:
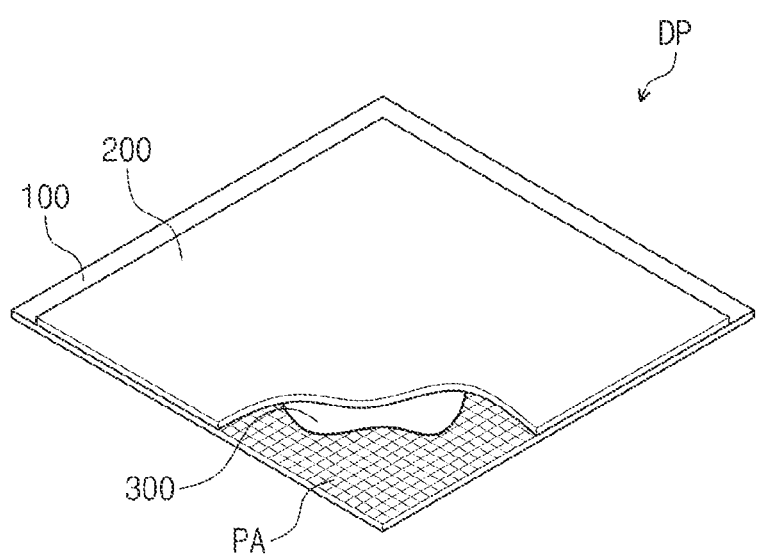
FIG. 1B is a perspective view illustrating a portion of the display device shown in FIG. 1A according to some exemplary embodiments.

FIG. 1A is a block diagram schematically illustrating a display device according to some exemplary embodiments. FIG. 1B is a perspective view illustrating a portion of the display device shown in FIG. 1A according to some exemplary embodiments. In detail, an exploded perspective view of a display panel DP is illustrated in FIG. 1B according to some exemplary embodiments. Hereinafter, some exemplary embodiments of the inventive concepts will be described with reference to FIGS. 1A and 1B.

As shown in FIG. 1A, a display device DS may include a signal control unit (or part) TC, a gate driving part GD, a data driving part DD, and a display panel DP.

The display panel DP may be electrically connected to the gate driving part GD and the data driving part DD, and may be driven by electrical signals, which are transmitted from the gate driving part GD and the data driving part DD. The display panel DP may be, for example, one of an organic light emitting display panel, a liquid crystal display panel, a plasma display device, an electrophoretic display panel, and an electrowetting display panel, but the inventive concepts are not limited to a specific kind of display panel. For descriptive and illustrative purposes, a liquid crystal display device including a liquid crystal display panel will be described as an example of the display device DS.

The display device DS may further include a backlight unit (not shown), which is configured to provide light to the display panel DP, and an optical member (not illustrated) including a polarization plate. When an image is displayed on the display panel DP, the display panel DP may control a transmission amount of light, which is provided from the backlight unit.

The display panel DP may include a plurality of signal lines G1-Gm ("m" being a natural number greater than one) and D1-Dn ("n" being a natural number greater than one) and a plurality of pixels PX connected to the signal lines G1-Gm and D1-Dn. The signal lines G1-Gm and D1-Dn may include a plurality of first data lines D1-Dn−1 and a plurality of gate lines G1-Gm.

The first data lines D1-Dn−1 may extend in a first direction DR1 and may be arranged in a second direction DR2. The first data lines D1-Dn−1 may connect the data driving part DD to the pixels PX. The first data lines D1-Dn−1 may be used to provide data signals from the data driving part DD to the pixels PX, respectively.

The gate lines G1-Gm may extend in the second direction DR2 and may be arranged in the first direction DR1. The gate lines G1-Gm may be provided to cross the first data lines D1-Dn−1 in an insulated manner. The gate lines G1-Gm may connect the gate driving part GD to the pixels PX. The gate lines G1-Gm may be used to provide gate signals from the gate driving part GD to the pixels PX, respectively.

The pixels PX may be arranged in both of the first and second directions DR1 and DR2 or in a matrix shape. Each of the pixels PX may include a thin-film transistor and a liquid crystal capacitor connected thereto. Charge amounts of the liquid crystal capacitors of the pixels PX may be respectively controlled to display an image. This will be described in more detail below.

Each of the pixels PX may be connected to a corresponding one of the data lines D1-Dn and to a corresponding one of the gate lines G1-Gm. As seen in FIG. 1A, the pixels PX may be arranged to form a plurality of columns, and the pixels PX in one column may be alternately connected to two data lines in a row-by-row manner. However, this is just one example of the arrangement of the pixels PX, and according to embodiments of the inventive concepts, the display panel DP may be configured to have various pixel arrangements.

The signal control unit TC may be configured to provide electrical signals, for controlling operations of the gate driving part GD and the data driving part DD, to the gate driving part GD and the data driving part DD. The signal control unit TC may be configured to receive input image signals RGB, to convert the input image signals RGB to image data R'G'B', which are suitable for the operations of the display panel DP, and to output the image data R'G'B'. In addition, the signal control unit TC may be also configured to receive a variety of control signals CS (e.g., a vertical synchronization signal, a horizontal synchronization signal, a main clock signal, and a data enable signal) and to output first and second control signals CONT1 and CONT2.

The data driving part DD may receive the first control signal CONT1 and the image data R'G'B'. The data driving part DD may be configured to convert the image data R'G'B' to data voltages and to provide the data voltages to the data lines D1-Dn. The first control signal CONT1 may include a horizontal start signal for starting an operation of the data driving part DD, an inverting signal for inverting a polarization of the data voltage, an output instruction signal for determining when the data voltage is output from the data driving part DD, and so forth.

The gate driving part GD may output gate signals to the gate lines G1-Gm in response to the second control signal CONT2. The second control signal CONT2 may include a vertical start signal for starting an operation of the gate driving part GD, a gate clock signal for determining when a gate voltage is output, an output enable signal for determining an on-pulse width of the gate voltage, and so forth.

Referring to FIG. 1B, the display panel DP may include a first substrate 100, a second substrate 200, and a liquid crystal layer 300, when viewed in a sectional view. The first substrate 100 may include a plurality of pixel regions PA. The pixels PX may be provided on (or in) the pixel regions PA, respectively. Although not shown, the first substrate 100 may include some elements of the pixels PX.

The second substrate 200 may be provided on the first substrate 100. Although not shown, the second substrate 200 may include some elements of the pixels PX.

The liquid crystal layer 300 may be provided between the first substrate 100 and the second substrate 200. The liquid crystal layer 300 may include liquid crystal molecules (not shown). The liquid crystal molecules may include a material whose alignment can be controlled by an electric field produced in the pixel regions PA. In some exemplary embodiments, the liquid crystal layer 300 may be used as a part of the pixel PX.

Figure 2:
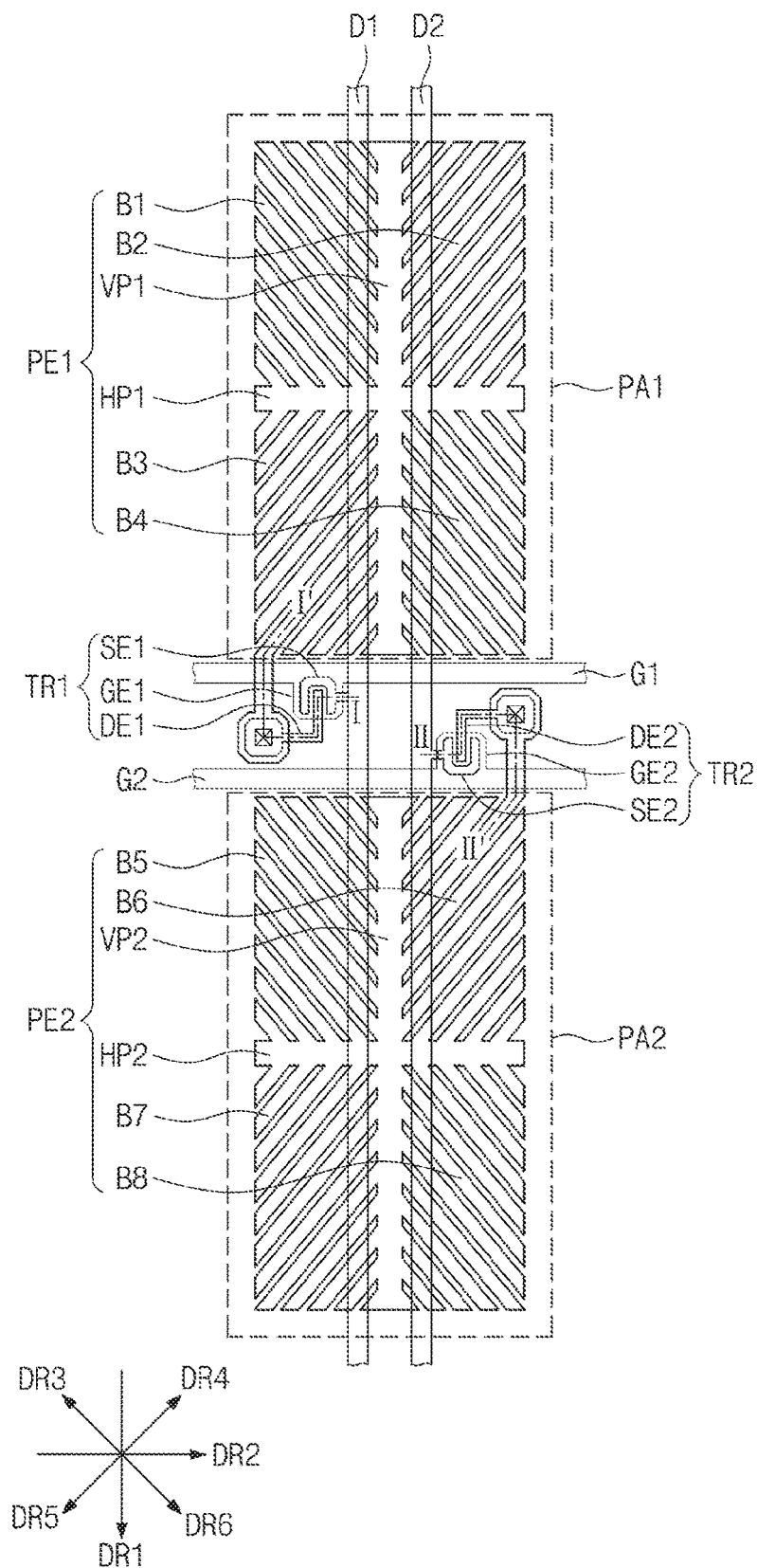
FIG. 2 is a plan view illustrating a portion of a display panel according to some exemplary embodiments.
Figure 3A:
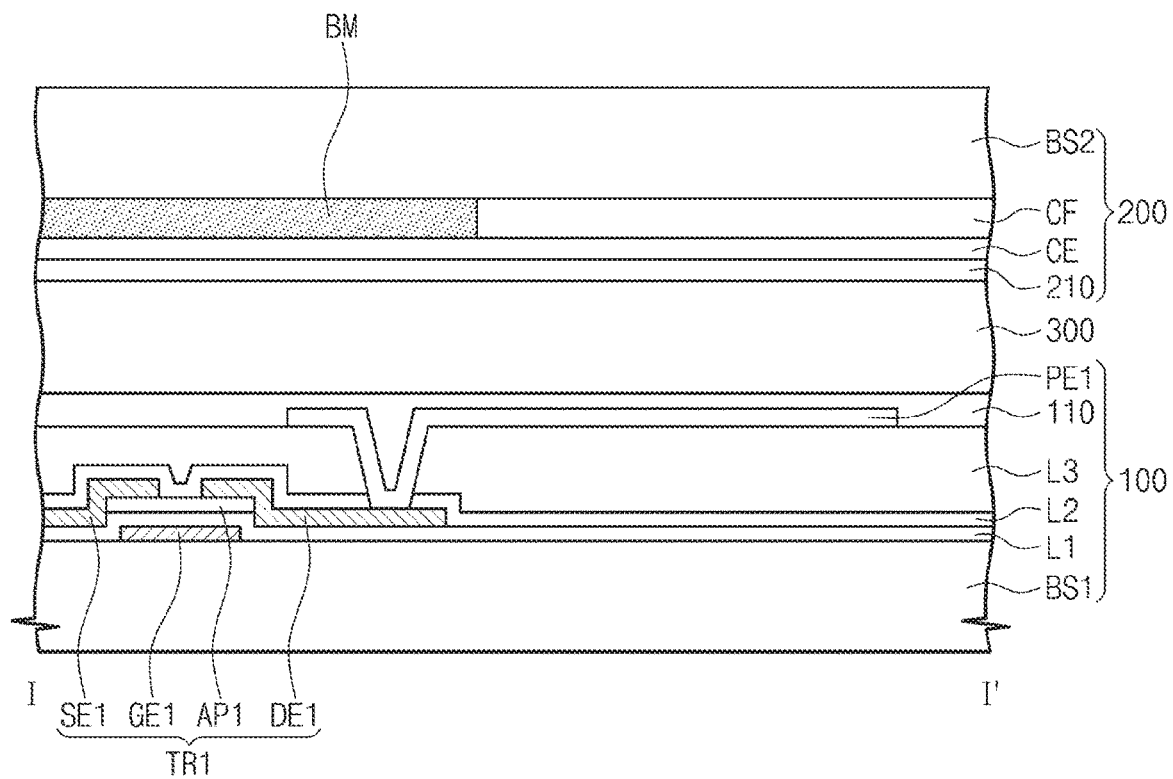
FIG. 3A is a sectional view taken along sectional line I-I' of FIG. 2 according to some exemplary embodiments.
Figure 3B:
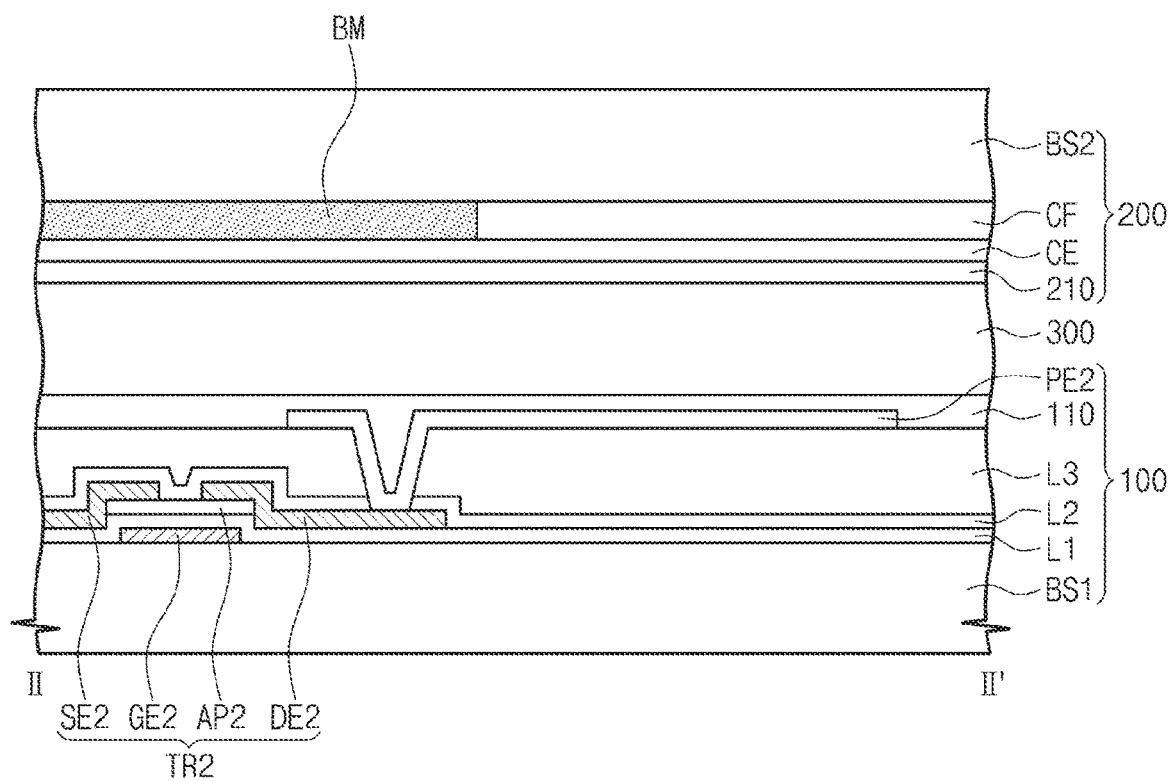
FIG. 3B is a sectional view taken along sectional line II-II' of FIG. 2 according to some exemplary embodiments.

FIG. 2 is a plan view illustrating a portion of a display panel according to some exemplary embodiments. FIG. 3A is a sectional view taken along sectional line I-I' of FIG. 2 according to some exemplary embodiments. FIG. 3B is a sectional view taken along sectional line II-IT of FIG. 2 according to some exemplary embodiments. In detail, a plan view of the first substrate 100 is illustrated in FIG. 2, and sectional views of the display panel DP are illustrated in FIGS. 3A and 3B. Hereinafter, a display panel according to some exemplary embodiments will be described with reference to FIGS. 2 to 3B.

For convenience in illustration, portions (e.g., a first pixel region PA1 and a second pixel region PA2) of the pixel region PA of FIG. 1B is exemplarily illustrated in FIGS. 2 to 3B. The first pixel region PA1 may be a region in which light emitted from a first pixel is displayed. The first pixel may be connected to a first gate line G1 and a first data line D1.

The first pixel may include a first thin-film transistor TR1 and a first liquid crystal capacitor. The first liquid crystal capacitor may include a first pixel electrode PE1, a common electrode CE, and the liquid crystal layer 300. The first pixel region PA1 may be substantially defined by the first pixel electrode PE1.

The second pixel region PA2 may be a region in which light emitted from a second pixel is displayed. The second pixel may be connected to a second gate line G2 and a second data line D2. The second pixel may include a second thin-film transistor TR2 and a second liquid crystal capacitor. The second liquid crystal capacitor may include a second pixel electrode PE2, the common electrode CE, and the liquid crystal layer 300. The second pixel region PA2 may be substantially defined by the second pixel electrode PE2.

The first substrate 100 may include a first base substrate BS1, the first gate line G1, the second gate line G2, the first data line D1, the second data line D2, the first thin-film transistor TR1, the second thin-film transistor TR2, the first pixel electrode PE1, the second pixel electrode PE2, a first alignment layer 110, and a plurality of insulating layers L1, L2, and L3. The insulating layers L1, L2, and L3 may include a first insulating layer L1, a second insulating layer L2, and a third insulating layer L3, as exemplarily illustrated in FIGS. 3A and 3B.

The first base substrate BS1 may include an insulating material. The first base substrate BS1 may be optically transparent. Thus, when light is emitted from a backlight unit (not shown) placed (or disposed) below the first base substrate BS1, the light may be allowed to be incident into the liquid crystal layer 300 through the first base substrate BS1. For example, the first base substrate BS1 may include a glass substrate or a plastic substrate.

The first gate line G1 and the second gate line G2 may be provided between the first base substrate BS1 and the first insulating layer L1. The first gate line G1 may include a protruding portion (hereinafter, a first control electrode GE1) extended in the first direction DR1. The first thin-film transistor TR1 may be connected to the first gate line G1 to receive a gate signal to be transmitted through the first gate line G1.

The second gate line G2 may include a protruding portion (hereinafter, a second control electrode GE2) extended in the first direction DR1. The second thin-film transistor TR2 may be connected to the second gate line G2 to receive a gate signal to be transmitted through the second gate line G2.

The gate signal to be transmitted through the second gate line G2 may be different from the gate signal to be transmitted through the first gate line G1. This means that the first and second thin-film transistors TR1 and TR2 can be independently controlled by different gate lines G1 and G2.

A first semiconductor pattern AP1 and a second semiconductor pattern AP2 may be provided on the first insulating layer L1. The first semiconductor pattern AP1 and the second semiconductor pattern AP2 may be spaced apart from the first control electrode GE1 and the second control electrode GE2, respectively, with the first insulating layer L1 interposed therebetween, when viewed in a sectional view.

Each of the first and second semiconductor patterns AP1 and AP2 may include a semiconductor material. For example, the semiconductor material may include at least one of amorphous silicon, poly silicon, single crystalline silicon, oxide semiconductor, or compound semiconductor. The first and second semiconductor patterns AP1 and AP2 may include the same material as or materials different from each other, but the inventive concepts are not limited thereto.

A first input electrode SE1, a first output electrode DE1, a second input electrode SE2, and a second output electrode DE2 may be provided between the first insulating layer L1 and the second insulating layer L2. The first input electrode SE1 may be a portion of the first data line D1 that is extended in the second direction DR2. The second input electrode SE2 may be a portion of the second data line D2 that is extended in the second direction DR2. That is, the first and second data lines D1 and D2 may be provided on the same layer as that for the first input electrode SE1, the first output electrode DE1, the second input electrode SE2, and the second output electrode DE2.

Referring to FIG. 2, the first input electrode SE1 may have a shape enclosing one end of the first output electrode DE1. An opposite end of the first output electrode DE1 may be extended from the one end and may be overlapped with a contact hole, which is used for connection to the first pixel electrode PE1. The second input electrode SE2 may have a shape enclosing one end of the second output electrode DE2. An opposite end of the second output electrode DE2 may be extended from the one end and may be overlapped with a contact hole, which is used for connection to the second pixel electrode PE2.

Referring back to FIGS. 2 to 3B, each of the first input electrode SE1 and the first output electrode DE1 may be provided on the same layer as that for the first semiconductor pattern AP1 and may be in direct contact with the first semiconductor pattern AP1. Each of the second input electrode SE2 and the second output electrode DE2 may be provided on the same layer as that for the second semiconductor pattern AP2 and may be in direct contact with the second semiconductor pattern AP2. However, this is just one of various example embodiments of the inventive concepts, and the first input electrode SE1, the first output electrode DE1, the second input electrode SE2, and the second output electrode DE2 may be provided on a layer different from that for the first and second semiconductor patterns AP1 and AP2, and may be connected to the first and second semiconductor patterns AP1 and AP2 through additional contact holes. That is, the structures of the first and second thin-film transistors TR1 and TR2 may be variously changed.

The second insulating layer L2 may be provided to cover the first and second thin-film transistors TR1 and TR2. The second insulating layer L2 may be formed of or include an inorganic material. The second insulating layer L2 may protect the first and second thin-film transistors TR1 and TR2.

In some exemplary embodiments, a third insulating layer L3 may be provided on the second insulating layer L2. The third insulating layer L3 may be formed of or include at least one of organic and inorganic materials. The third insulating layer L3 may be provided to have a flat top surface, e.g., may be a planarization layer. The first and second pixel electrodes PE1 and PE2 may be provided on the third insulating layer L3, thereby having flat surfaces.

The first and second pixel electrodes PE1 and PE2 may be arranged in the first direction DR1. The first and second pixel electrodes PE1 and PE2 may be disposed spaced apart from each other with the first and second gate lines G1 and G2 interposed therebetween, when viewed in a plan view.

As seen in FIG. 2, each of the first and second pixel electrodes PE1 and PE2 may be overlapped with the first and second data lines D1 and D2, when viewed in a plan view. The first and second data lines D1 and D2 may be provided to cross each of the first and second pixel electrodes PE1 and PE2 in the first direction DR1.

The first pixel electrode PE1 may include a first vertical portion VP1, a first horizontal portion HP1, and a plurality of first branch portions B1-B4. The first vertical portion VP1, the first horizontal portion HP1, and the first branch portions B1-B4 may be connected to each other, thereby forming a single body (i.e., the first pixel electrode PE1).

The first vertical portion VP1 may extend in the first direction DR1. The first vertical portion VP1 may extend parallel to the first and second data lines D1 and D2. The first vertical portion VP1 may be provided adjacent to the first and second data lines D1 and D2. For instance, the first vertical portion VP1 may, when viewed in a plan view, extend between the first and second data lines D1 and D2.

The first horizontal portion HP1 may be connected to the first vertical portion VP1. The first horizontal portion HP1 may extend in the second direction DR2. The first horizontal portion HP1 may be provided to cross the first vertical portion VP1 and may be connected to the first vertical portion VP1. As seen in FIG. 2, the first vertical portion VP1 may be provided to cross a midpoint of the first horizontal portion HP1 in its length direction.

The first branch portions B1-B4 may be connected to the first horizontal portion HP1 or the first vertical portion VP1. Each of the first branch portions B1-B4 may extend in one of directions crossing the first and second directions DR1 and DR2.

The first branch portions B1-B4 may be radially extended from the first horizontal portion HP1 and the first vertical portion VP1. The first branch portions B1-B4 may be classified into a plurality of sub-branch portions, depending on their directions extending from the first horizontal portion HP1 or the first vertical portion VP1.

For example, the first branch portions B1-B4 may be classified into first to fourth sub-branch portions B1-B4. The first to fourth sub-branch portions B1-B4 may define a plurality of domains to be described below.

The first sub-branch portions B1 may extend from the first horizontal portion HP1 or the first vertical portion VP1 in a third direction DR3. The first sub-branch portions B1 may be patterns that are arranged to be spaced apart from each other in a fourth direction DR4.

The second sub-branch portions B2 may extend from the first horizontal portion HP1 or the first vertical portion VP1 in the fourth direction DR4. The second sub-branch portions B2 may be patterns that are arranged to be spaced apart from each other in the third direction DR3.

The third sub-branch portions B3 may extend from the first horizontal portion HP1 or the first vertical portion VP1 in a fifth direction DR5. The third sub-branch portions B3 may be patterns that are arranged to be spaced apart from each other in the third direction DR3.

The fifth direction DR5 may be a direction that is opposite to the fourth direction DR4. That is, the third sub-branch portions B3 may extend in a direction parallel to the second sub-branch portions B2.

The fourth sub-branch portions B4 may extend from the first horizontal portion HP1 or the first vertical portion VP1 in a sixth direction DR6. The fourth sub-branch portions B4 may be patterns that are arranged to be spaced apart from each other in the fourth direction DR4.

The sixth direction DR6 may be a direction that is opposite to the third direction DR3. That is, the fourth sub-branch portions B4 may extend in a direction parallel to the first sub-branch portions B1.

The second pixel electrode PE2 may include a second vertical portion VP2, a second horizontal portion HP2, and a plurality of second branch portions B5-B8. The second vertical portion VP2, the second horizontal portion HP2, and the second branch portions B5-B8 may be connected to each other, thereby forming a single body (i.e., the second pixel electrode PE2). The second branch portions B5-B8 may be classified into fifth to eighth sub-branch portions B5-B8, depending on their directions extending from the second vertical portion VP2 and the second horizontal portion HP2.

As seen in FIG. 2, the second pixel electrode PE2 may have substantially the same shape as the first pixel electrode PE1. In other words, the second vertical portion VP2, the second horizontal portion HP2, and the second branch portions B5-B8 may correspond to the first vertical portion VP1, the first horizontal portion HP1, and the first branch portions B1-B4, respectively, of the first pixel electrode PE1. Furthermore, the fifth to eighth sub-branch portions B5-B8 may correspond to the first to fourth sub-branch portions B1-B4, respectively, of the first pixel electrode PE1. Hereinafter, description of overlapping elements previously described may be omitted.

Since the first and second pixel electrodes PE1 and PE2 include the first branch portions B1-B4 and the second branch portions B5-B8, it may be possible to realize a plurality of gradation levels in each pixel region. Liquid crystal molecules in the liquid crystal layer 300 may have alignment characteristics that are dependent on the extension directions of the first branch portions B1-B4 and the second branch portions B5-B8. Thus, since it is possible to realize various gradations in each pixel region, the display panel DP may be used to display an image with improved color reproduction characteristics and to realize a high resolution display device. This will be described in more detail below.

According to various exemplary embodiments, each of the first and second pixel electrodes PE1 and PE2 may be overlapped with a plurality of data lines, when viewed in a plan view. For example, each of the first and second pixel electrodes PE1 and PE2 may be overlapped with all of the first and second data lines D1 and D2, when viewed in a plan view.

As an example, each of the first and second pixel electrodes PE1 and PE2 may be provided on the first and second data lines D1 and D2, when viewed in a sectional view. The first pixel electrode PE1 may be overlapped with not only the first data line D1, which is connected to the first thin-film transistor TR1, but also the second data line D2, which is not connected to the first thin-film transistor TR1. The second pixel electrode PE2 may be overlapped with not only the second data line D2, which is connected to the second thin-film transistor TR2, but also the first data line D1, which is not connected to the second thin-film transistor TR2.

As seen in FIG. 2, the first data line D1 may be provided at a side of the first vertical portion VP1, and the second data line D2 may be provided at an opposite side of the second vertical portion VP2. The first and second data lines D1 and D2 may be spaced apart from each other in the second direction DR2, with the first vertical portion VP1 interposed therebetween, when viewed in a plan view.

The first data line D1 may be provided at a side of the second vertical portion VP2, and the second data line D2 may be provided at an opposite side of the second vertical portion VP2. The first and second data lines D1 and D2 may be spaced apart from each other in the second direction DR2, with the second vertical portion VP2 interposed therebetween, when viewed in a plan view.

Although not shown, the first vertical portion VP1 may be overlapped with the first data line D1 or the second data line D2, when viewed in a plan view. Furthermore, the second vertical portion VP2 may be overlapped with the first data line D1 or the second data line D2, when viewed in a plan view. This will be described in more detail below.

According to some exemplary embodiments, since the data lines D1 and D2 are provided to be overlapped with the pixel electrodes PE1 and PE2, it may be possible to reduce a distance between adjacent pixel regions of the display panel DP and to increase an occupying area of the pixel region PA to a given area. Thus, an area of a non-display region may be reduced, and this may make it possible to easily design a high resolution display panel.

Furthermore, in the display panel DP according to some exemplary embodiments, the data lines D1 and D2 may be provided adjacent to the vertical portions VP1 and VP2 of the pixel electrodes PE1 and PE2, and thus, it may be possible to prevent the data lines D1 and D2 from being overlapped with an outer edge of the pixel region PA. Accordingly, it may be possible to improve lateral visibility of the display panel DP. This will be described in more detail below.

Referring back to FIGS. 3A and 3B, the first alignment layer 110 may be provided to cover the first and second pixel electrodes PE1 and PE2. The first alignment layer 110 may be in contact with the liquid crystal layer 300. The first alignment layer 110 may further include a reactive mesogen for increasing an adhesive strength with the liquid crystal molecules.

The second substrate 200 may include a second base substrate BS2, a color filter CF, a light-blocking layer BM, the common electrode CE, and a second alignment layer 210. The second base substrate BS2 may be an optically transparent insulating substrate.

The common electrode CE may be configured to produce an electric field along with the pixel electrode PE. Each of the first and second pixel electrodes PE1 and PE2, along with the common electrode CE and the liquid crystal layer 300, may constitute one or more liquid crystal capacitors.

The light-blocking layer BM may be provided to be overlapped with the thin-film transistors TR1 and TR2. The light-blocking layer BM may prevent the thin-film transistors TR1 and TR2 from being recognized by a user and may prevent (or at least reduce) light from being leaked through the thin-film transistors TR1 and TR2.

The color filter CF may be provided to be overlapped with the first and second pixel electrodes PE1 and PE2. The color filter CF may be provided to correspond to the pixel region PA and may be used to emit light having a specific wavelength or color toward the outside.

Although not shown, at least one of the common electrode CE, the color filter CF, and the light-blocking layer BM may be provided on the first base substrate BS1, thereby constituting part of the first substrate 100. The structure of the display panel DP may be variously changed.

FIGS. 4A, 4B, 4C, and 4D are perspective views schematically illustrating a portion of a display panel according to various exemplary embodiments. FIGS. 4A to 4D show a difference in alignment of liquid crystal molecules according to regions of the first pixel electrode PE1.

Figure 4A:
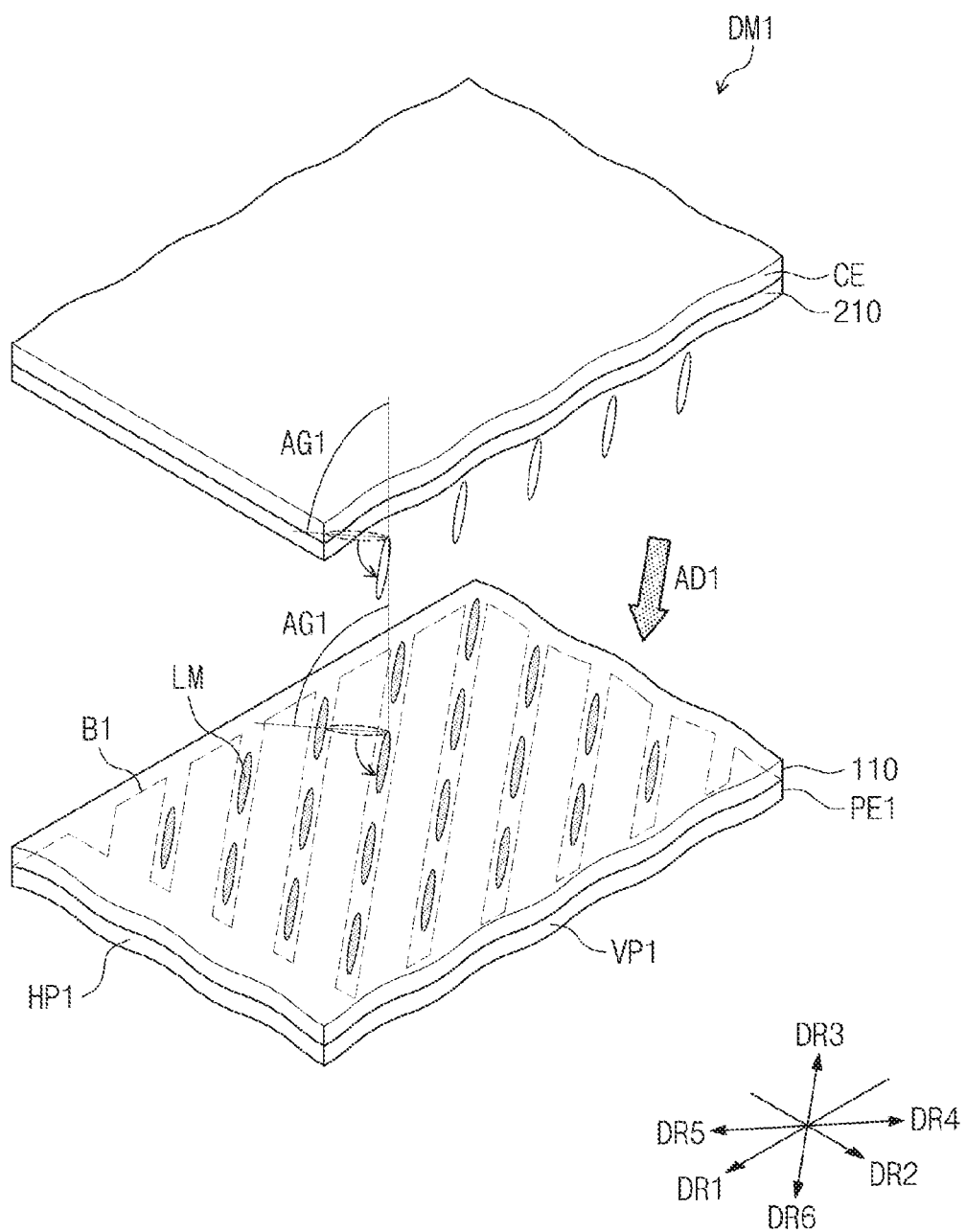
FIGS. 4A, 4B, 4C, and 4D are perspective views schematically illustrating a portion of a display panel according to various exemplary embodiments.
Figure 4B:
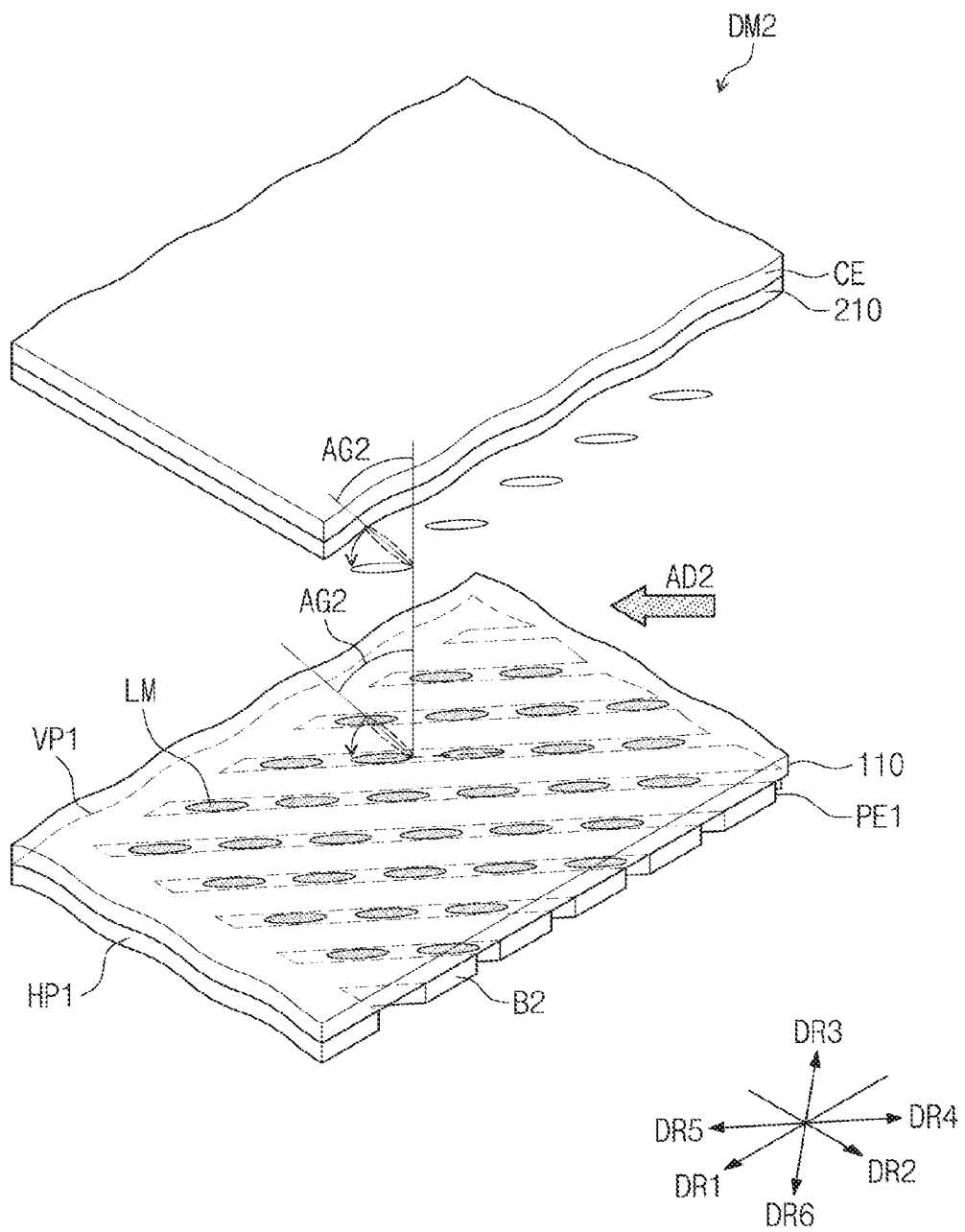
Figure 4C:
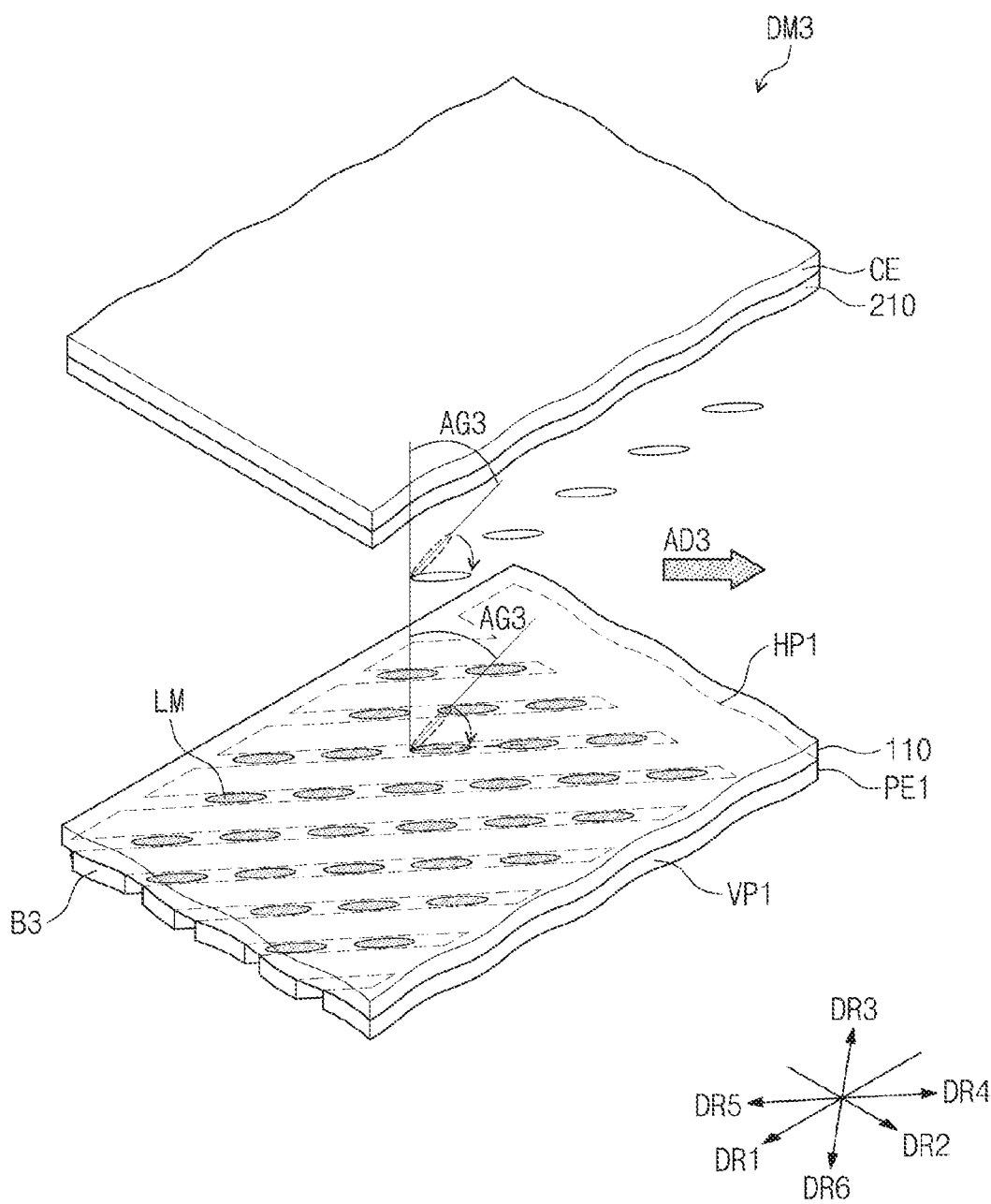
Figure 4D:
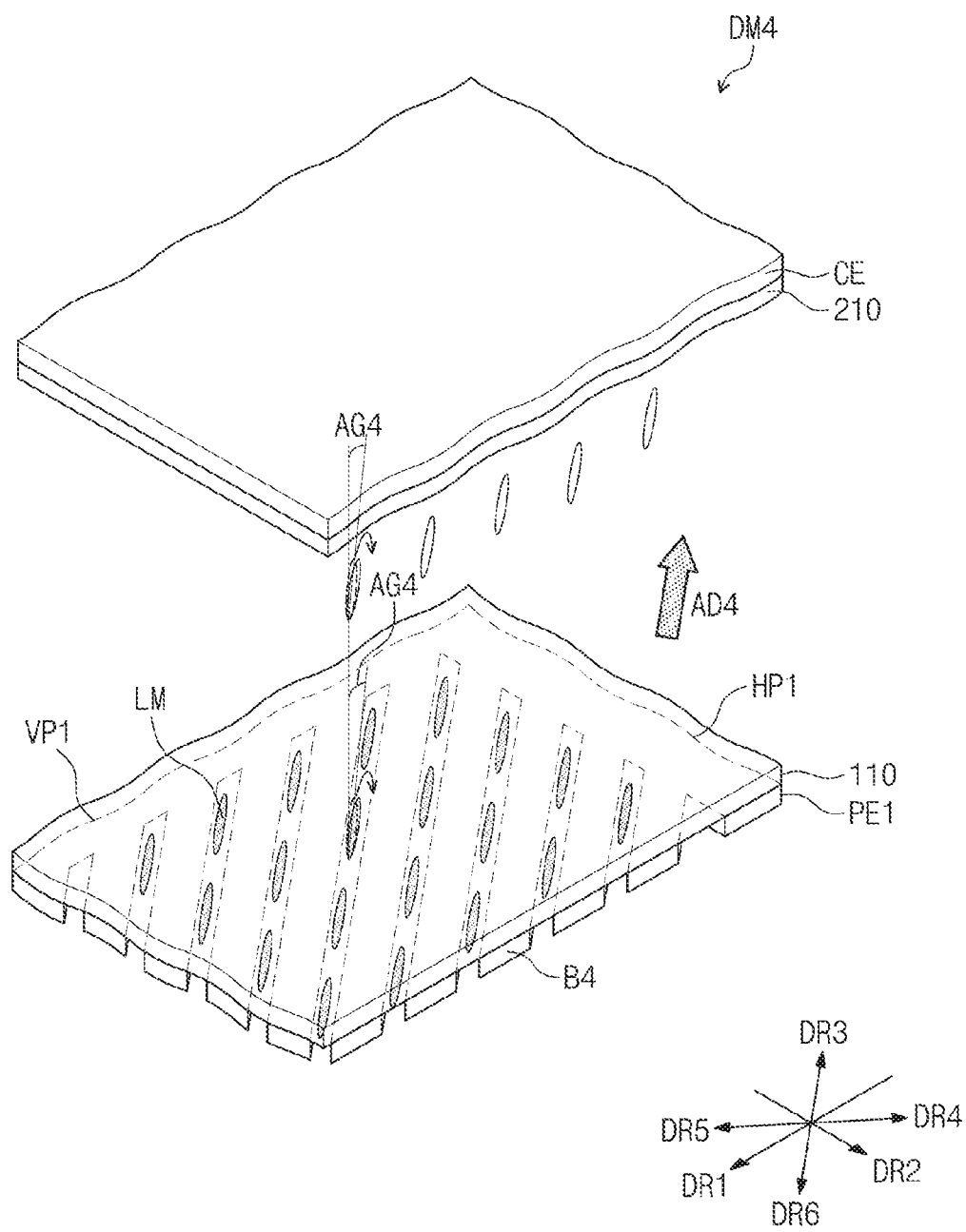

FIG. 4A shows the alignment of liquid crystal molecules on the first sub-branch portions B1 caused by an electric field. FIG. 4B shows the alignment of liquid crystal molecules on the second sub-branch portions B2 caused by the electric field. FIG. 4C shows the alignment of liquid crystal molecules on the third sub-branch portions B3 caused by the electric field. FIG. 4D shows the alignment of liquid crystal molecules on the fourth sub-branch portions B4 caused by the electric field. Hereinafter, the display panel DP according to some exemplary embodiments will be described with reference to FIGS. 4A to 4D. For concise description, an element previously described with reference to FIGS. 1A to 3B may be identified by the same reference number without repeating an overlapping description thereof.

As shown in FIG. 4A, each of the first sub-branch portions B1 may extend from the first vertical portion VP1 or the first horizontal portion HP1 in the third direction DR3.

When there is no electric field between the first pixel electrode PE1 and the common electrode CE, some of liquid crystal molecules LM, which are located adjacent to the first pixel electrode PE1, may be slantingly aligned at a first pre-tilt angle AG1 by the first alignment layer 110 (e.g., see FIG. 3A), and some of the liquid crystal molecules LM, which are located adjacent to the common electrode CE, may be slantingly aligned at the first pre-tilt angle AG1 by a second alignment layer 310 (e.g., see FIG. 3A).

Thereafter, if an electric field is produced, the liquid crystal molecules LM may be further slanted to have an alignment direction parallel to the first branch portions B1, when viewed in a plan view. A first domain DM1 may be defined as a region in which the liquid crystal molecules LM aligned by the first sub-branch portions B1 are provided, and a first liquid crystal alignment direction AD1 may be defined as an alignment direction of the liquid crystal molecules LM, which are aligned by the electric field in the first domain DM1. In this case, the first liquid crystal alignment direction AD1 in the first domain DM1 may be parallel to the extension direction of the first branch portions B1 and may be parallel to the sixth direction DR6 that is oriented toward the first horizontal portion HP1 and the first vertical portion VP1.

Similarly, as shown in FIG. 4B, each of the second sub-branch portions B2 may extend from the first vertical portion VP1 or the first horizontal portion HP1 in the fourth direction DR4. When there is no electric field between the first pixel electrode PE1 and the common electrode CE, some of the liquid crystal molecules LM, which are located adjacent to the first pixel electrode PE1, may be slantingly aligned at a second pre-tilt angle AG2 by the first alignment layer 110, and some of the liquid crystal molecules LM, which are located adjacent to the common electrode CE, may be slantingly aligned at the second pre-tilt angle AG2 by the second alignment layer 210.

Thereafter, if an electric field is produced, the liquid crystal molecules LM may be further slanted to have an alignment direction parallel to the second sub-branch portions B2, when viewed in a plan view. In a second domain DM2, in which the liquid crystal molecules LM are aligned by the second sub-branch portions B2, a second liquid crystal alignment direction AD2 of the liquid crystal molecules LM aligned by an electric field may be parallel to the extension direction of the second sub-branch portions B2 and may be parallel to the fifth direction DR5 that is oriented toward the first horizontal portion HP1 and the first vertical portion VP1.

Similarly, as shown in FIG. 4C, each of the third sub-branch portions B3 may extend from the first vertical portion VP1 or the first horizontal portion HP1 in the fifth direction DR5. When there is no electric field between the first pixel electrode PE1 and the common electrode CE, some of the liquid crystal molecules LM, which are located adjacent to the first pixel electrode PE1, may be slantingly aligned at a third pre-tilt angle AG3 by the first alignment layer 110, and some of the liquid crystal molecules LM, which are located adjacent to the common electrode CE, may be slantingly aligned at the third pre-tilt angle AG3 by the second alignment layer 210.

Thereafter, if an electric field is produced, the liquid crystal molecules LM may be further slanted to have an alignment direction parallel to the third sub-branch portions B3, when viewed in a plan view. In a third domain DM3, in which the liquid crystal molecules LM are aligned by the third sub-branch portions B3, a third liquid crystal alignment direction AD3 of the liquid crystal molecules LM aligned by an electric field may be parallel to the extension direction of the third sub-branch portions B3 and may be parallel to the fourth direction DR4 that is oriented toward the first horizontal portion HP1 and the first vertical portion VP1.

Similarly, as shown in FIG. 4D, each of the fourth sub-branch portions B4 may extend from the first vertical portion VP1 or the first horizontal portion HP1 in the sixth direction DR6. When there is no electric field between the first pixel electrode PE1 and the common electrode CE, some of the liquid crystal molecules LM, which are located adjacent to the first pixel electrode PE1, may be slantingly aligned at a fourth pre-tilt angle AG4 by the first alignment layer 110, and some of the liquid crystal molecules LM, which are located adjacent to the common electrode CE, may be slantingly aligned at the fourth pre-tilt angle AG4 by the second alignment layer 210.

Thereafter, if an electric field is produced, the liquid crystal molecules LM may be further slanted to have an alignment direction parallel to the fourth sub-branch portions B4, when viewed in a plan view. In a fourth domain DM4, in which the liquid crystal molecules LM are aligned by the fourth sub-branch portions B4, a fourth liquid crystal alignment direction AD4 of the liquid crystal molecules LM aligned by an electric field may be parallel to the extension direction of the fourth sub-branch portions B4 and may be parallel to the third direction DR3 that is oriented toward the first horizontal portion HP1 and the first vertical portion VP1.

In the display panel DP according to various exemplary embodiments, the first pixel electrode PE1 may be provided to define a plurality of domains, and thus, each pixel region PA may be divided into a plurality of regions having different liquid crystal alignment directions. Accordingly, it may be possible to display a plurality of gradation levels in each pixel region PA and to realize a high resolution display panel with improved color reproduction characteristics. The same is also true for the second pixel electrode PE2.

Figure 5A:
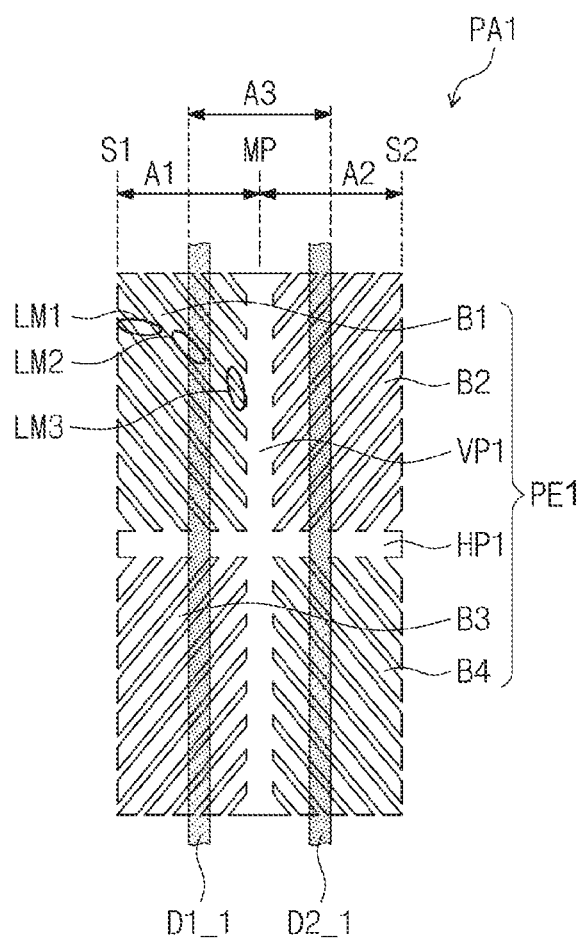
FIGS. 5A, 5B, 5C, and 5D are plan views illustrating pixel regions according to various exemplary embodiments.
Figure 5A:
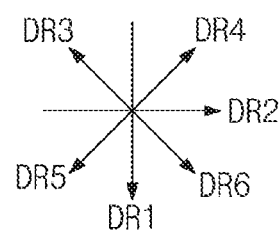
Figure 5B:
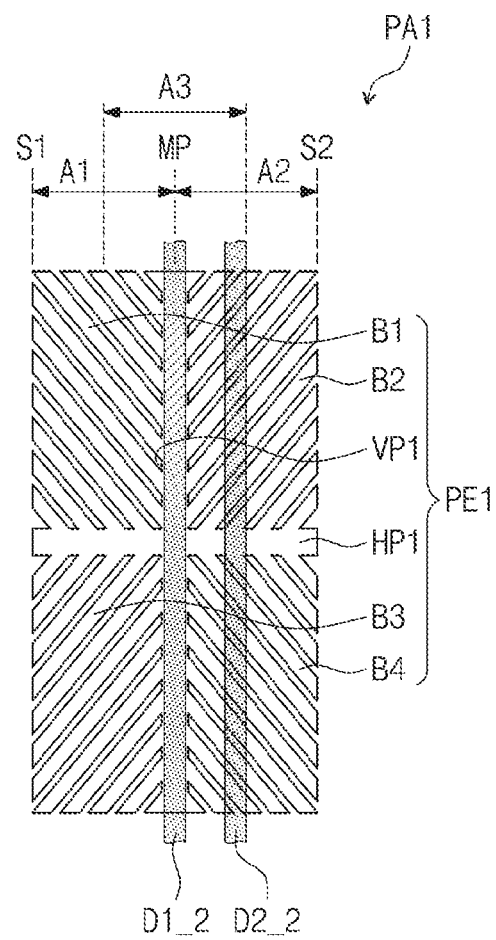
Figure 5B:
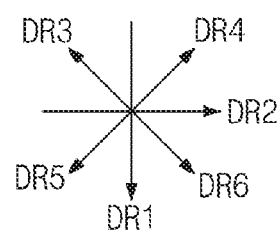
Figure 5C:
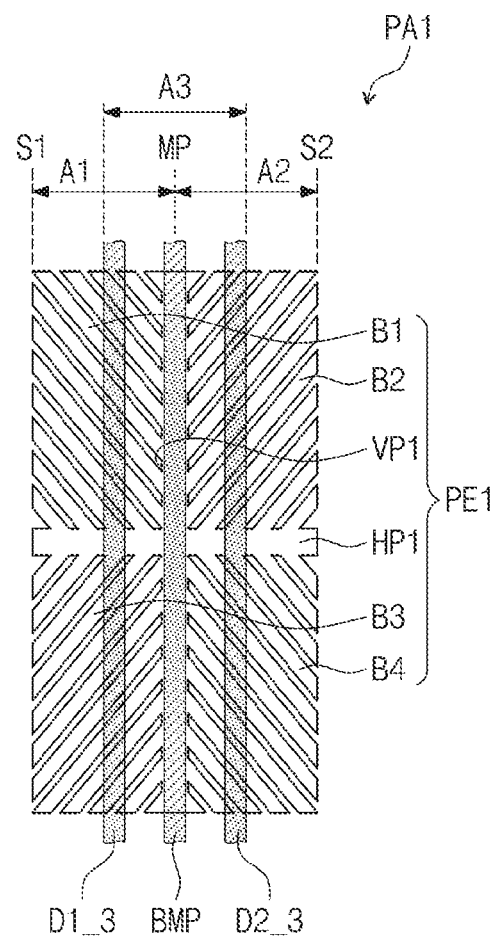
Figure 5C:
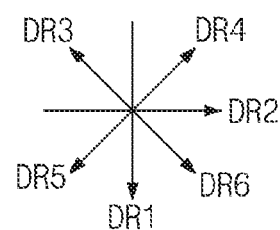

FIGS. 5A, 5B, and 5C are plan views illustrating pixel regions according to various exemplary embodiments. For convenience in illustration, the first pixel region PA1 is illustrated in FIGS. 5A to 5C, and the first pixel electrode PE1 of FIG. 5A is used as a reference. Hereinafter, some exemplary embodiments will be described with reference to FIGS. 5A to 5C. For concise description, an element previously described with reference to FIGS. 1A to 4D may be identified by the same reference number without repeating an overlapping description thereof.

As shown in FIG. 5A, the first horizontal portion HP1 may include a first sector A1 and a second sector A2. The first sector A1 and the second sector A2 may be divided by the first vertical portion VP1. As seen in FIG. 5A, the first vertical portion VP1 may be provided to cross a midpoint MP of the first horizontal portion HP1. Thus, the first sector A1 and the second sector A2 may have the same length in the second direction DR2.

According to some exemplary embodiments, a region between a midpoint of the first sector A1 and a midpoint of the second sector A2 may be defined as a center region A3. The center region A3 may be defined as a rectangular region, which has a width corresponding to a length between the midpoints of the first and second sectors A1 and A2 and has a length corresponding to the length of the first vertical portion VP1. The first vertical portion VP1 may be provided to cross a center of the center region A3 in the second direction DR2.

As described above, a first data line D1_1 and a second data line D2_1 may be overlapped with the first pixel electrode PE1, when viewed in a plan view. Here, the first data line D1_1 and the second data line D2_1 may be disposed to be closer to the first vertical portion VP1 than to an outer edge of the first pixel electrode PE1. In other words, the first data line D1_1 and the second data line D2_1 may be provided in the center region A3. Each of the first data line D1_1 and the second data line D2_1 may be overlapped with a region of the first horizontal portion HP1 located between the midpoints of the first and second sectors A1 and A2, when viewed in a plan view.

Thus, the first data line D1_1 and the second data line D2_1 may be spaced apart from a first side S1 and a second side S2, which define the outer edge of the first pixel electrode PE1, in the second direction DR2. The first data line D1_1 and the second data line D2_1 may not be overlapped with the first side S1 and the second side S2, when viewed in a plan view.

FIG. 5A illustrates an example in which the first data line D1_1 is provided at a left edge of the center region A3 and the second data line D2_1 is provided at a right edge of the center region A3. The first data line D1_1 and the second data line D2_1 may be spaced apart from each other in the second direction DR2 with the first vertical portion VP1 interposed therebetween.

As shown in FIG. 5A, the first pixel region PA1 may be a region through which light generated by a first pixel is emitted, and may substantially correspond to a region provided with the first pixel electrode PE1. For convenience in illustration, three liquid crystal molecules (e.g., LM1, LM2, and LM3) placed in the same domain are exemplarily illustrated in FIG. 5.

The liquid crystal molecules LM1, LM2, and LM3 may have liquid crystal alignment directions different from each other, when viewed in a plan view. As described above, the liquid crystal molecules in the first domain DM1 (e.g., see FIG. 4A) may be aligned by the first sub-branch portions B1 to have a liquid crystal alignment direction parallel to the sixth direction DR6.

However, liquid crystal molecules provided at a border of the first domain DM1 may have a liquid crystal alignment direction that is inclined by an angle to the third direction DR3. For convenience in illustration, FIG. 5A illustrates a first liquid crystal molecule LM1, a second liquid crystal molecule LM2, and a third liquid crystal molecule LM3, which are spaced apart from each other in the second direction DR2.

The first liquid crystal molecule LM1 is illustrated to schematically depict an alignment of a liquid crystal molecule provided in a region adjacent to the first side S1 (i.e., a region adjacent to an outer edge of the first pixel electrode PE1; hereinafter, an outer region). A portion of the first pixel electrode PE1, which affects the alignment of the first liquid crystal molecule LM1, may be a portion defining the first side S1 (i.e., end portions of the first sub-branch portions B1). Accordingly, the liquid crystal alignment direction of the first liquid crystal molecule LM1 may be relatively weakly affected by the first sub-branch portions B1. Thus, the liquid crystal alignment angle of the first liquid crystal molecule LM1 with respect to the second direction DR2 may be less than 45°.

The third liquid crystal molecule LM3 is illustrated to schematically depict an alignment of a liquid crystal molecule provided in a region adjacent to a midpoint MP of the first horizontal portion HP1 (i.e., adjacent to the first vertical portion VP1) (hereinafter, an inner region). A portion of the first pixel electrode PE1, which affects the alignment of the third liquid crystal molecule LM3, may be end portions of the first sub-branch portions B1 connected to the first horizontal portion HP1 or the first vertical portion VP1. Furthermore, the alignment of the third liquid crystal molecule LM3 may be affected by an electric field, which is produced not only by the first sub-branch portions B1 but also by the first vertical portion VP1.

Thus, the third liquid crystal molecule LM3 may be greater than the second liquid crystal molecule LM2, in terms of a liquid crystal alignment angle to the second direction DR2. The liquid crystal alignment angle of the third liquid crystal molecule LM3 may be greater than 45°. The liquid crystal alignment angle of the third liquid crystal molecule LM3 may become close to 90°, with decreasing distance from the vertical portion VP1.

Similarly, with increasing distance from the first vertical portion VP1 in a direction away from the second sub-branch portions B2, a liquid crystal alignment angle, with respect to the second direction DR2, of liquid crystal molecules provided in the second domain DM2 (e.g., see FIG. 4B) may be decreased from 90°.

The second liquid crystal molecule LM2 is illustrated to schematically depict an alignment of a liquid crystal provided in a region between the outer region and the inner region (hereinafter, an intermediate region). The intermediate region may include a region, which is overlapped with the center region A3, and another region, which is not overlapped with the center region A3.

A portion of the first pixel electrode PE1, which affects the alignment of the second liquid crystal molecule LM2, may be middle portions of the first sub-branch portions B1. The second liquid crystal molecule LM2 may be affected by an electric field produced by only the first sub-branch portions B1. The second liquid crystal molecule LM2 may be aligned by a relatively strong electric field, compared with the first liquid crystal molecule LM1.

Thus, the liquid crystal alignment direction of the second liquid crystal molecule LM2 may be parallel to the third direction DR3 or the extension direction of the first sub-branch portions B1. The liquid crystal alignment angle, with respect to the second direction DR2, of the second liquid crystal molecule LM2 may be about 45°. That is, the center region A3 may correspond to a region, in which an alignment angle of a liquid crystal with respect to the second direction DR2 is greater than or equal to 45°.

In some exemplary embodiments, since the first data line D1_1 and the second data line D2_1 are provided on the center region A3, the first data line D1_1 and the second data line D2_1 may not cover a region in which a liquid crystal molecule having a relatively small alignment angle with respect to the second direction DR2 is provided. Accordingly, it may be possible to prevent (or at least reduce) transmittance and visibility properties of a display panel from being deteriorated at a border of an outer edge of a pixel region, and thereby to improve lateral visibility of the display panel.

As shown in FIG. 5B, at least one of a first data line D1_2 and a second data line D2_2 may be overlapped with the first vertical portion VP1. For example, the first data line D1_2 may be provided to be overlapped with the first vertical portion VP1. The second data line D2_2 may be provided at a right side of the first vertical portion VP1.

The first data line D1_2 may be provided on the center region A3 to cross the midpoint MP of the first horizontal portion HP1. The second data line D2_2 may be spaced apart from the first data line D1_2. The second data line D2_2 may be provided on the center region A3 and may be spaced apart from the first vertical portion VP1, when viewed in a plan view. The second data line D2_2 may be provided between the midpoint MP of the first horizontal portion HP1 and the second side S2, e.g., in the second sector A2.

As shown in FIG. 5B, if the first data line D1_2 and/or the second data line D2_2 are provided on the center region A3 and at least one of the data lines is provided to extend along the first vertical portion VP1, positions of the first and/or second data lines D1_2 and D2_2 may be variously changed. Here, in the pixel region PA1, there is a region in which a region veiled (or overlapped) by the first and second data lines D1_2 and D2_2 is overlapped with a region veiled by the first vertical portion VP1. In other words, a total area of a light-blocking region in the pixel region PA1 (i.e., veiled by the first data line D1_2, the second data line D2_2, and the first vertical portion VP1) may be less than a sum of occupying areas of the first data line D1_2, the second data line D2_2, and the first vertical portion VP1 in the pixel region PAL In this manner, the light-blocking region in the center region A3 may be further reduced, and thus, the pixel region PA1 may have an improved transmittance property.

As shown in FIG. 5C, the display panel according to some exemplary embodiments may further include a light-blocking pattern BMP. The light-blocking pattern BMP may include a material having low optical transmittance. The light-blocking pattern BMP may include the same material as that of a first data line D1_3 or a second data line D2_3. The light-blocking pattern BMP may be formed simultaneously using the same mask as that for the first and second data lines D1_3 and D2_3. However, the inventive concepts are not limited thereto, and in some exemplary embodiments, the light-blocking pattern BMP may be formed independently regardless of the first and second data lines D1_3 and D2_3.

The light-blocking pattern BMP may be provided between the first and second data lines D1_4 and D2_4. The first data line D1_4, the light-blocking pattern BMP, and the second data line D2_4 may be spaced apart from each other in the second direction DR2.

The light-blocking pattern BMP may be provided to be overlapped with the first vertical portion VP1, when viewed in a plan view. Thus, each of the first and second data lines D1_3 and D2_3 may be provided on the center region A3 and may be spaced apart from the first vertical portion VP1, when viewed in a plan view.

In the display panel according to some exemplary embodiments, one of the first data lines D1_2 and D1_3, the second data lines D2_2 and D2_3, and the light-blocking pattern BMP may be overlapped with the first vertical portion VP1, and thus, it may be possible to clearly define a boundary between domains, to prevent a light leakage issue from occurring in the boundary between the domains, and to improve a display property of a display panel.

Furthermore, in the display panel according to various exemplary embodiments, the first data lines D1_2 and D1_3, the second data lines D2_2 and D2_3, and the light-blocking pattern BMP may be provided in the center region A3 to be adjacent to the first vertical portion VP1, and this may make it possible to improve a lateral visibility property at the border of the outer edge of the pixel region PA1.

Moreover, in the display panel according to some exemplary embodiments, the first data lines D1_2 and D1_3 or the second data lines D2_2 and D2_3 may be designed to realize a light blocking of the first vertical portion VP1, and thus, regardless of the presence or absence of the light-blocking pattern BMP, it may be possible to improve a display property of the pixel region PA1 and to realize a high resolution display device.

Figure 5D:
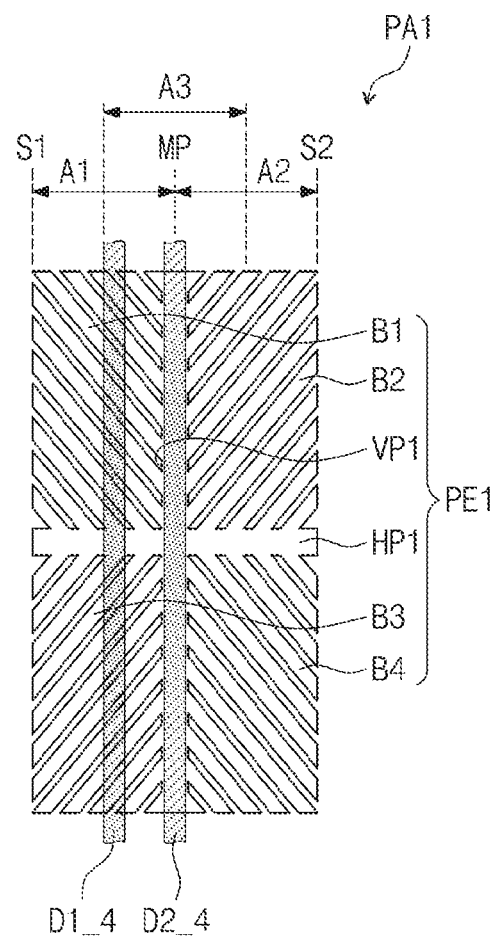
Figure 5D:
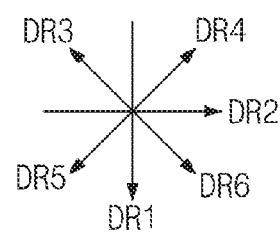

And FIG. 5D illustrates an example in which at least one of the first data line D1_4 and the second data line D2_4 is provided to be overlapped with the first vertical portion VP1. For example, as shown in FIG. 5D, the second data line D2_4 may be provided to be overlapped with the first vertical portion VP1. The first data line D1_4 may be provided at a left side of the first vertical portion VP1. In some embodiments, the pixel shown in FIG. 5D may be configured to have substantially a mirror symmetric shape of the pixel structure of FIG. 5B with respect to the midpoint MP of the first horizontal portion HP1. However, the inventive concepts are not limited thereto, and in some exemplary embodiments, shapes of the pixel areas may be variously changed if one of data lines is provided to be overlapped with the vertical portion of the pixel electrode.

Figure 6A:
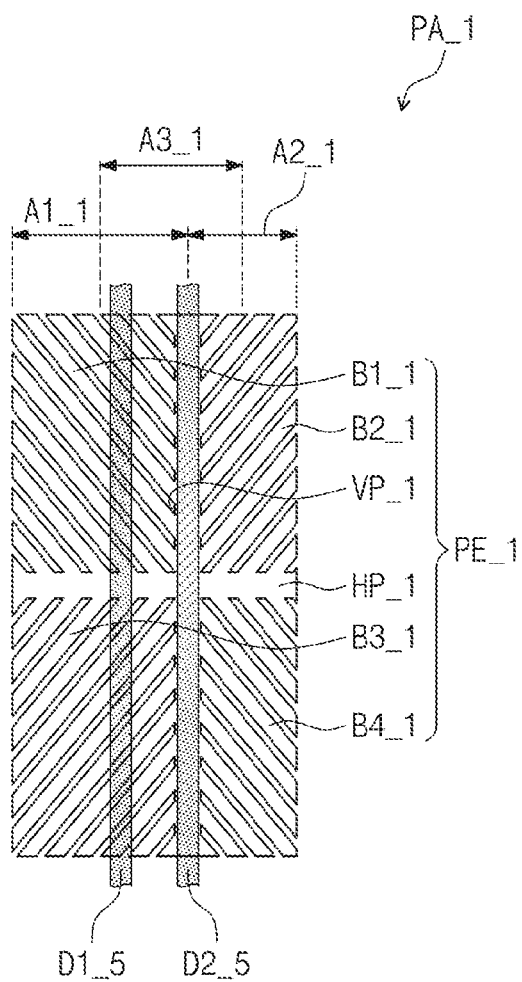
FIGS. 6A and 6B are plan views illustrating pixel regions according to some exemplary embodiments.
Figure 6B:
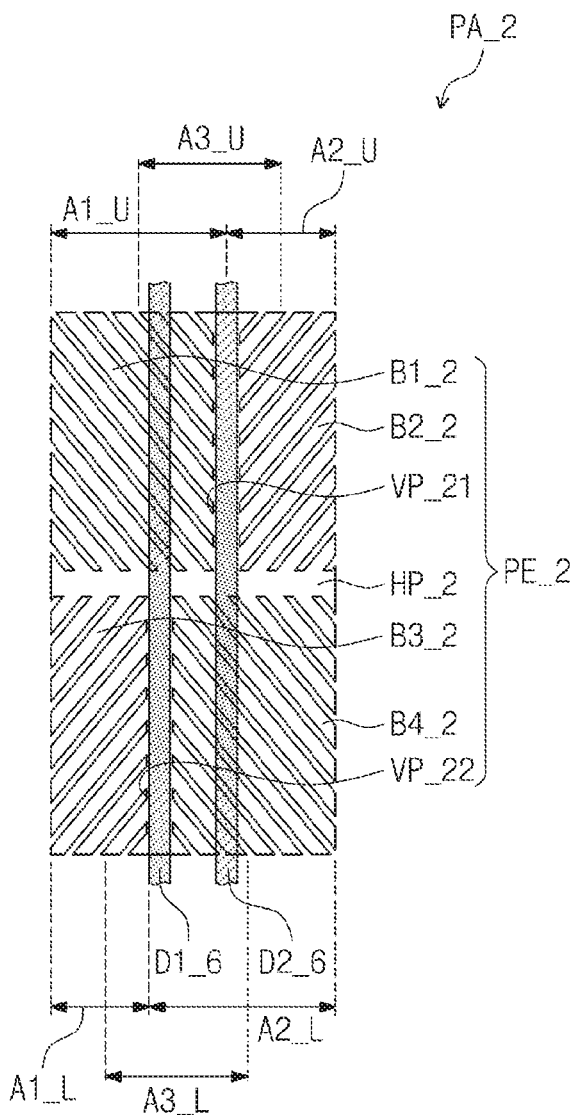
Figure 7:
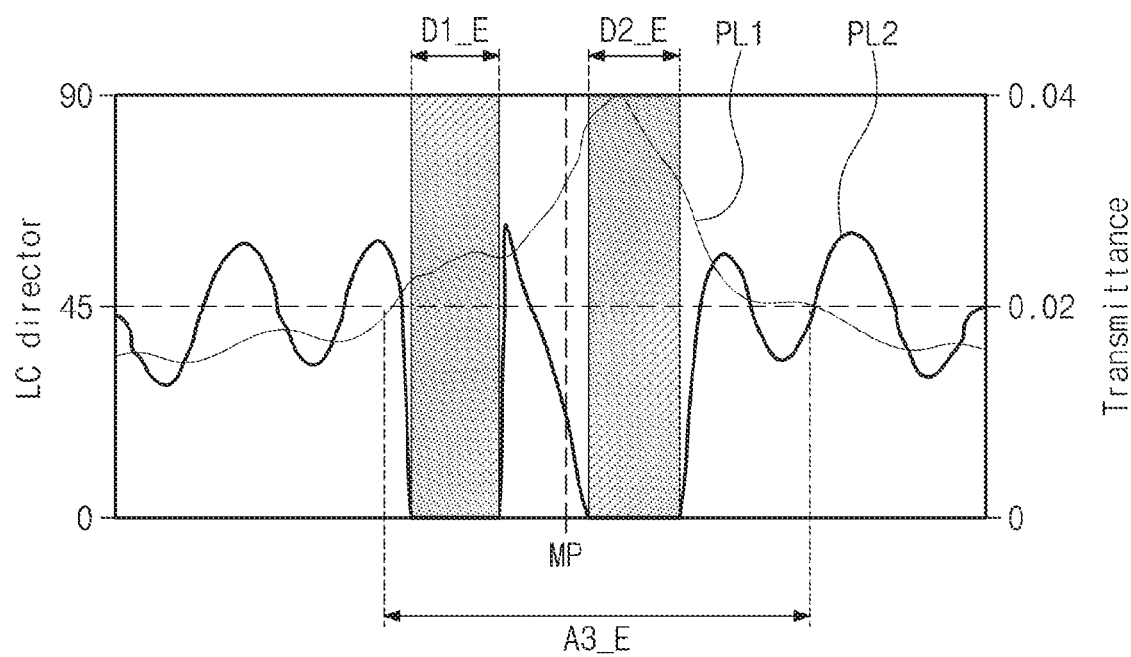
FIG. 7 is a graph showing spatial variations of liquid crystal alignment and transmittance in the pixel region according to some exemplary embodiments.

FIGS. 6A and 6B are plan views illustrating pixel regions according to some exemplary embodiments. FIG. 7 is a graph showing spatial variations of liquid crystal alignment and transmittance in the pixel region according to some exemplary embodiments. For convenience in illustration, pixel regions PA_1 and PA_2 are exemplarily illustrated in FIGS. 6A and 6B. A graph PL1 showing a spatial variation of liquid crystal alignment and a graph PL2 showing a spatial variation of transmittance are illustrated together in FIG. 7. Hereinafter, some exemplary embodiments will be described with reference to FIGS. 6A, 6B, and 7. For concise description, an element previously described with reference to FIGS. 1A to 5D may be identified by the same reference number without repeating an overlapping description thereof.

As shown in FIG. 6A, a pixel electrode PE_1 provided in the pixel region PA_1 may include a horizontal portion HP_1, a vertical portion VP_1, and a plurality of branch portions B1_1, B2_1, B3_1, and B4_1. The horizontal portion HP_1 may be a line-shaped pattern extending in the second direction DR2.

The vertical portion VP_1 may be a line-shaped pattern extending in the first direction DR1. The vertical portion VP_1 may be connected to the horizontal portion HP_1. As seen in FIG. 7A, the vertical portion VP_1 may be connected to a portion of the horizontal portion HP_1, which is spaced apart from a midpoint of the horizontal portion HP_1 in the second direction DR2.

Accordingly, a first sector A1_1 and a second sector A2_1 divided by the vertical portion VP_1 may have different widths when measured in the second direction DR2. As seen in FIG. 7A, the first sector A1_1 is illustrated to have a width larger than that of the second sector A2_1. That is, the vertical portion VP_1 may be provided at a position that is off-centered in the second direction DR2, compared with the first pixel electrode PE1 of FIG. 2.

A center region A3_1 may be defined between a center position of the first sector A1_1 and a center position of the second sector A2_1. Since the first sector A1_1 and the second sector A2_1 are asymmetrically defined about the vertical portion VP_1, the center region A3_1 may be defined to be off-centered with respect to the vertical portion VP_1. As seen in FIG. 7A, the center region A3_1 may be formed in such a way that a left region of the vertical portion VP_1 has an area larger than that of a right region of the vertical portion VP_1.

A first data line D1_5 and a second data line D2_5 may be provided on the center region A3_1. As seen in FIG. 7A, the first data line D1_5 may be provided at a left side of the vertical portion VP_1, and the second data line D2_5 may be provided to be overlapped with the vertical portion VP_1, when viewed in a plan view.

In some exemplary embodiments, even if the pixel electrode PE_1 has a horizontally asymmetric shape, the center region A3_1, on which the data lines D1_5 and D2_5 are provided, may be defined in a manner corresponding thereto. Thus, even if a horizontally asymmetric domain is formed, positions of the data lines D1_5 and D2_5 may be changed to improve lateral visibility and display characteristics of a display panel and to easily realize a high resolution display panel.

As shown in FIG. 6B, a pixel electrode PE_2 provided on the pixel region PA_2 may include a horizontal portion HP_2, vertical portions VP_21 and VP_22, and a plurality of branch portions B1_2, B2_2, B3_2, and B4_2. The horizontal portion HP_2 may be a line-shaped pattern extending in the second direction DR2.

The vertical portions VP_21 and VP_22 may include a first portion VP_21 and a second portion VP_22, which are divided by the horizontal portion HP_2. Each of the first portion VP_21 and the second portion VP_22 may extend in the first direction DR1 and may be connected to the horizontal portion HP_2. The first portion VP_21 and the second portion VP_22 may be spaced apart from each other in the second direction DR2. In other words, the first portion VP_21 and the second portion VP_22 may be connected to two different positions of the horizontal portion HP_2.

The first portion VP_21 may divide the horizontal portion HP_2 into a first upper sector A1_U and a second upper sector A2_U. An upper center region A3_U may be defined between a center position of the first upper sector A1_U and a center position of the second upper sector A2_U.

The second portion VP_22 may divide the horizontal portion HP_2 into a first lower sector A1_L and a second lower sector A2_L. A lower center region A3_L may be defined between a center position of the first lower sector A1_L and a center position of the second lower sector A2_L.

The upper center region A3_U and the lower center region A3_L may include a portion that is not overlapped with each other, when viewed in the first direction DR1. In other words, the upper center region A3_U and the lower center region A3_L may be defined to be partially overlapped with each other in the first direction DR1.

A first data line D1_6 and a second data line D2_6 may be provided on the upper center region A3_U. Furthermore, the first data line D1_6 and the second data line D2_6 may be provided on the lower center region A3_L.

As seen in FIG. 6B, the first data line D1_6 and the second data line D2_6 may be provided to be overlapped with the first and second vertical portions VP_21 and VP_22, respectively. For example, the first data line D1_6 may be provided to be overlapped with the second portion VP_22 of the vertical portion. The second data line D2_6 may be provided to be overlapped with the first portion VP_21 of the vertical portion.

FIG. 7 shows spatial variations of liquid crystal alignment and transmittance in the pixel region according to FIGS. 6A and 6B. Especially, FIG. 7 shows spatial variations of liquid crystal alignment and transmittance of upper region from the horizontal portion HP_1 or HP_2. However, the inventive concepts are not limited thereto, and in some exemplary embodiments, plots PL1 and PL2 of FIG. 7 may be shown at the pixel areas of FIGS. 5A, 5B, 5C, and 5D. For convenience in illustration, in FIG. 7, the first and second data lines D1_E and D2_E are illustrated by shaded patterns. Referring to the first graph PL1 of FIG. 7 (i.e., showing an alignment angle of a liquid crystal molecule with respect to the second direction DR2 or an LC director), the alignment angle of the liquid crystal molecule is about 90° at the midpoint MP, where the first vertical portion VP1 is provided, and is gradually decreased in a direction from the midpoint MP (refer to FIG. 5A) toward the first side S1 (refer to FIG. 5A) or in the second direction DR2.

Referring to the second graph PL2 of FIG. 7 (i.e., showing transmittance in the pixel region PA_1 or PA_2), the transmittance may vary or oscillate within a range from about 0.01 to 0.03 in the second direction DR2. That is, unlike the first graph PL1 increasing or decreasing in a specific region, the variation of the transmittance may occur in a similar manner, without a difference between the center region A3_E and other regions except for the center region A3_E.

In regions where the first and second data lines D1_E and D2_E are provided, the transmittance may be zero. That is, the transmittance may be deteriorated by the first and second data lines D1_E and D2_E. That is, referring to the second graph PL2, the transmittance may be dependent on positions of the first and second data lines D1_E and D2_E.

In the case where the liquid crystal alignment angle of the liquid crystal molecule is small, it is difficult to realize a low gradation level. That is, in FIG. 6B, the closer the angle is to 90°, the higher the difficulty in realizing a low gradation level. In the case where the liquid crystal alignment angle is small, a difference in transmittance between pixel and non-pixel regions at a low gradation level may not be large, and thus, there may be an issue of deterioration in display characteristics. Furthermore, the smaller the liquid crystal alignment angle, the lower the lateral visibility and the more difficult the distinction between the domains. Thus, there may be a difficulty in realizing a wide viewing angle.

Accordingly, in the case of the first pixel region PA_1 or PA_2, optical quality of an image to be displayed on (or via) the first pixel region PA_1 or PA_2 may be more strongly dependent on transmittance at the border of the outer edge, and, thereby, not at a center region A3 of the first pixel region PA_1 or PA_2. By contrast, the greater the liquid crystal alignment angle, the easier the realization of the low gradation level. Furthermore, even if the transmittance is low at the center region A3, influence on optical quality of an image to be displayed throughout the first pixel region PA_1 or PA_2 may be relatively low, and it may be possible to improve transmittance and lateral visibility characteristics of a pixel region.

In the display panel according to some exemplary embodiments, the first data line D1_5 or D1_6 and the second data line D2_5 or D2_6 may be provided to be overlapped with the pixel electrode PE_1 or PE_2, when viewed in a plan view. Thus, it may be possible to increase an area of the first pixel region PA_1 or PA_2 and to reduce an area of a non-display region, e.g., a non-display region between pixels. As a result, it may be possible to easily realize a high resolution display panel.

Furthermore, in the display panel according to some exemplary embodiments, the first and second data lines D1_E and D2_E may be provided in a region (i.e., the center region A3) shifted toward the first vertical portion VP1, and thus, it may be possible to form a light-blocking region at a region in which liquid crystal molecules with a relatively large liquid crystal alignment angle with respect to the second direction DR2 are provided, and to prevent the light-blocking region from being formed at a border of an outer edge in which liquid crystal molecules with a relatively small liquid crystal alignment angle with respect to the second direction DR2 are provided. Accordingly, it may be possible to reduce influence of the first data line D1_5 or D1_6 and the second data line D2_5 or D2_6 on the border of the outer edge of the pixel region and to prevent lateral visibility from being deteriorated at the border of the outer edge of the pixel region. Furthermore, it may be possible to prevent issues (e.g., gamma failure or noise issue), which may occur when data lines in adjacent pixel regions are located adjacent to each other. Accordingly, a display panel with improved display and color-reproduction characteristics may be provided, and a display panel, which is designed to have an advantage in realizing a high resolution property, may be provided.

In the display panel according to some exemplary embodiments, a pixel electrode PE_2 may be provided to form domains that are asymmetric in horizontal and vertical directions. For the pixel electrode PE_2, the upper and lower center regions A3_U and A3_L, in which the first and second data lines D1_6 and D2_6 corresponding to the pixel electrode PE_2 are provided, may be defined. Accordingly, even if a domain is formed to be asymmetric in horizontal and vertical directions, it may be possible to improve lateral visibility and display characteristics of a display panel and to easily realize a high resolution display panel.

Figure 8A:
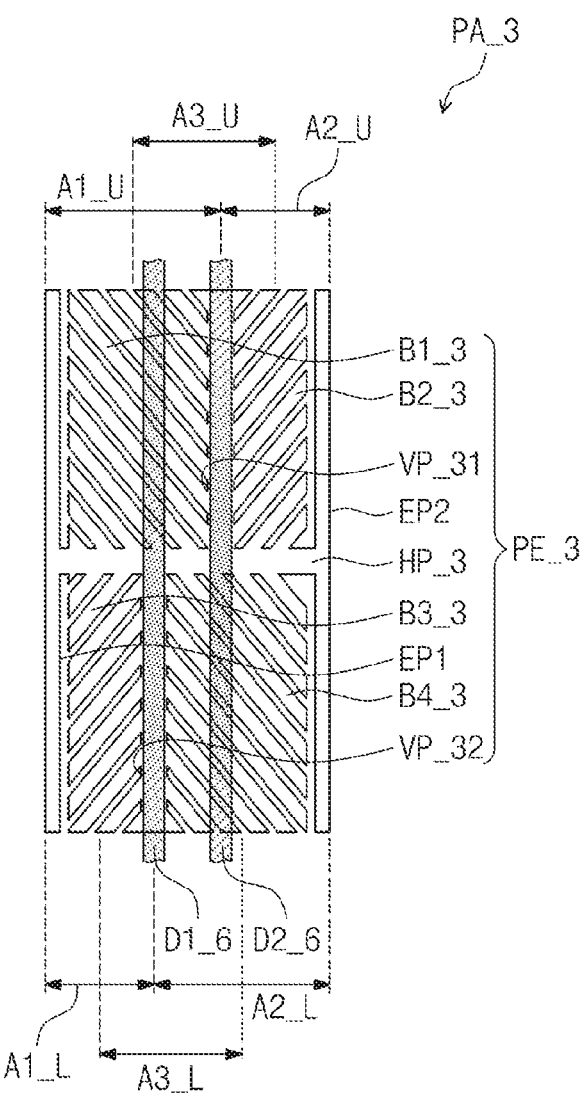
FIGS. 8A and 8B are plan views illustrating pixel regions according to some exemplary embodiments.
Figure 8A:
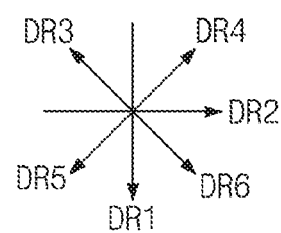
Figure 8B:
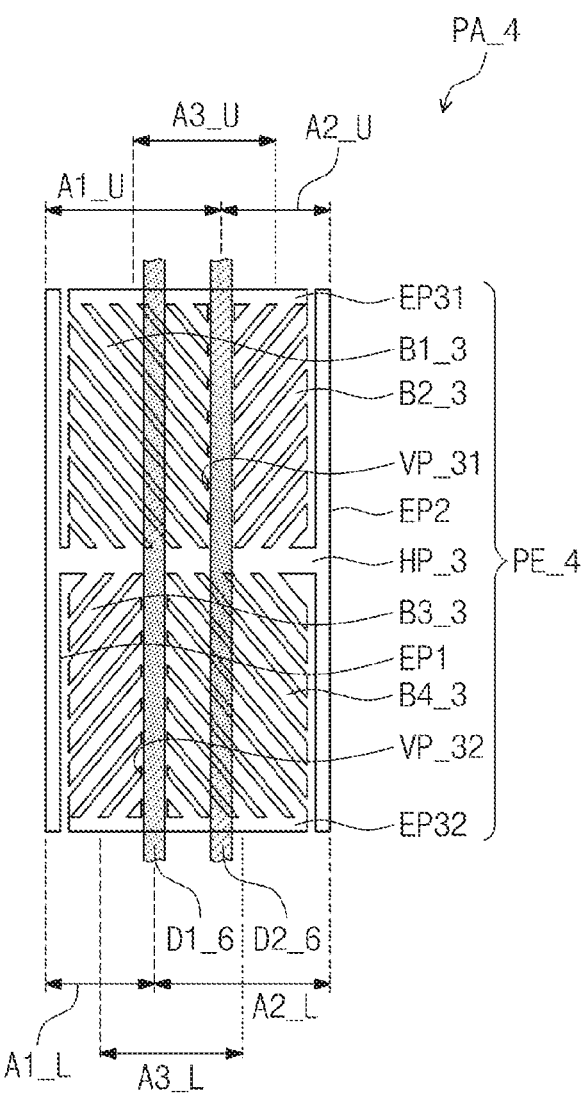
Figure 8B:
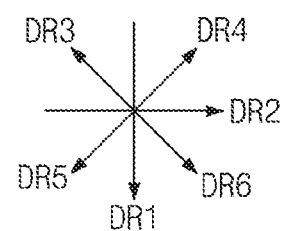

FIGS. 8A and 8B are plan views illustrating pixel regions according to some exemplary embodiments. For convenience in illustration, the pixel regions PA_3 and PA_4 are exemplarily illustrated in FIGS. 8A and 8B, respectively. Signal lines corresponding to the first and second data lines D1_6 and D2_6 shown in FIG. 7B may be provided in the pixel regions PA_3 and PA_4. Hereinafter, some exemplary embodiments will be described with reference to FIGS. 8A and 8B. For concise description, an element previously described with reference to FIGS. 1A to 7B may be identified by the same reference number without repeating an overlapping description thereof.

As shown in FIG. 8A, a pixel electrode PE_3 may include a horizontal portion HP_3, a first portion VP_31 of a vertical portion, a second portion VP_32 of the vertical portion, a plurality of branch portions B1_3, B2_3, B3_3, and B4_3, a first edge portion EP1, and a second edge portion EP2. Each of the horizontal portion HP_3, the first portion VP_31 of the vertical portion, the second portion VP_32 of the vertical portion, and the branch portions B1_3, B2_3, B3_3, and B4_3 may have the same shape and arrangement as a corresponding one of the horizontal portion HP_2, the first portion VP_21 of the vertical portion, the second portion VP_22 of the vertical portion, and the branch portions B1_2, B2_2, B3_2, and B4_2 of FIG. 7B. Hereinafter, description of overlapping elements previously described may be omitted.

The first edge portion EP1 may be a line-shaped pattern extending in the first direction DR1. The first edge portion EP1 may be connected to one end of the horizontal portion HP_3. The first edge portion EP1 may be spaced apart from the first and third branch portions B1_3 and B3_3.

The second edge portion EP2 may be a line-shaped pattern extending in the first direction DR1. The second edge portion EP2 may be connected to an opposite end of the horizontal portion HP_3. The second edge portion EP2 may be spaced apart from the second and fourth branch portions B2_3 and B4_3. The first edge portion EP1 and the second edge portion EP2 may be provided to face each other in the second direction DR2.

According to some exemplary embodiments, the first data line D1_6 and a second data line E2_6 may not be overlapped with the first and second edge portions EP1 and EP2, when viewed in a plan view. The first data line D1_6 and the second data line E2_6 may be spaced apart from the first and second edge portions EP1 and EP2 in the second direction DR2.

The first data line D1_6 may be provided to be closer to the first portion VP_31 of the vertical portion than to the first edge portion EP1. A distance between the first data line D1_6 and the first edge portion EP1 may be larger than a distance between the first data line D1_6 and the first portion VP_31 of the vertical portion.

The second data line D2_6 may be provided to be closer to the second portion VP_32 of the vertical portion than to the second edge portion EP2. A distance between the second data line D2_6 and the second edge portion EP2 may be larger than a distance between the second data line D2_6 and the second portion VP_32 of the vertical portion.

As shown in FIG. 8B, a pixel electrode PE_4 may further include a plurality of horizontal edge portions EP31 and EP32. The horizontal edge portions EP31 and EP32 may include a first horizontal edge portion EP31 and a second horizontal edge portion EP32, which are provided to face each other in the first direction DR1.

The first horizontal edge portion EP31 may be a line-shaped pattern extending in the second direction DR2. The first horizontal edge portion EP31 may be connected to one end of the first portion VP_31 of the vertical portion. The first horizontal edge portion EP31 may be connected to ones of the first and second branch portions B1_3 and B2_3 adjacent thereto.

The second horizontal edge portion EP32 may be a line-shaped pattern extending in the second direction DR2. The second horizontal edge portion EP32 may be connected to one end of the second portion VP_32 of the vertical portion. The second horizontal edge portion EP32 may be connected to ones of the third and fourth branch portions B3_3 and B2_4 adjacent thereto.

An outer edge of the pixel electrode PE_4 may be defined by the first and second edge portions EP1 and EP2 and the horizontal edge portions EP31 and EP32. According to some exemplary embodiments, the first data line D1_6 and a second data line D2_6 may not be overlapped with the first and second edge portions EP1 and EP2, when viewed in a plan view. The first data line D1_6 and the second data line D2_6 may be provided to be closer to the first and second portions VP31 and VP32 of the vertical portion than to the first and second edge portions EP1 and EP2. Here, the first data line D1_6 and the second data line D2_6 may be overlapped with the horizontal edge portions EP31 and EP32, when viewed in a plan view. However, the inventive concepts are not limited thereto, and in some exemplary embodiments, the shape of the pixel electrode may be variously changed.

Figure 9A:
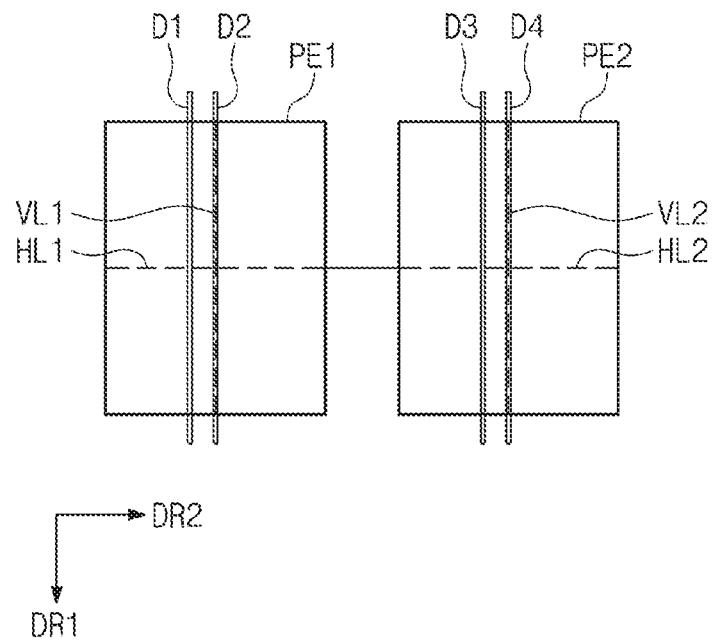
Figure 9B:
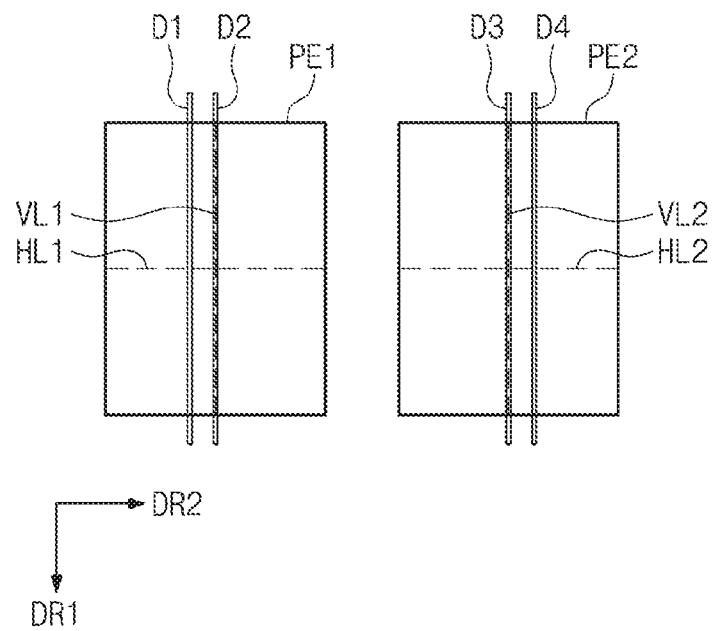

FIGS. 9A, 9B, and 9C are plan views illustrating a portion of a display panel according to some exemplary embodiments. Two pixel electrodes PE1 and PE2 arranged in the second direction DR2 are illustrated in FIGS. 9A and 9B, whereas six pixel electrodes PE1, PE2, PE3, PE4, PE5, and PE6 arranged in the second direction DR2 are illustrated in FIG. 9C.

The pixel electrodes PE1, PE2, PE3, PE4, PE5, and PE6 shown in FIGS. 9A to 9C may constitute the same pixel row. For example, the pixel electrodes PE1, PE2, PE3, PE4, PE5, and PE6 may constitute pixels that are connected to the same gate line. However, the inventive concepts are not limited thereto, and in some exemplary embodiments, the pixel electrodes PE1, PE2, PE3, PE4, PE5, and PE6 may constitute the same pixel row, but may be connected to gate lines different from each other.

Hereinafter, a display panel according to some exemplary embodiments will be described with reference to FIGS. 9A to 9C. For concise description, an element previously described with reference to FIGS. 1A to 8B may be identified by the same reference number without repeating an overlapping description thereof.

As shown in FIGS. 9A and 9B, horizontal lines HL1 and HL2 and vertical lines VL1 and VL2 may be defined in each of the first and second pixel electrodes PE1 and PE2 arranged in the second direction DR2. The horizontal lines HL1 and HL2 and the vertical lines VL1 and VL2 may represent positions of the horizontal portion HP and the vertical portion VP constituting the pixel electrode (e.g., see FIG. 2).

The horizontal line HL1 and the vertical line VL1 of the first pixel electrode PE1 may be defined to be connected to each other at their center positions. The horizontal line HL2 and the vertical line HL2 of the second pixel electrode PE2 may also be defined to be connected to each other at their center positions. In other words, the first and second pixel electrodes PE1 and PE2 may be designed to have the same shape.

As described above, each of the first and second pixel electrodes PE1 and PE2 may be overlapped with a plurality of data lines, when viewed in a plan view. The first pixel electrode PE1 may be overlapped with the first data line D1 and may be overlapped with the second data line D2, when viewed in a plan view.

The first pixel electrode PE1 may be connected to at least one of the first and second data lines D1 and D2, which overlap the first pixel electrode PE1 in a plan view, thereby constituting a pixel. For example, the first pixel electrode PE1 may be used to realize a gradation level corresponding to a data signal to be applied from at least one of the first and second data lines D1 and D2.

The second pixel electrode PE2 may be connected to at least one of a third data line D3 and a fourth data line D4, which overlap the second pixel electrode PE2 in a plan view, thereby constituting a pixel. For example, the second pixel electrode PE2 may be used to realize a gradation level corresponding to a data signal to be applied from at least one of the third and fourth data lines D3 and D4.

For example, the first data line D1 may be a conductive line that is connected to the first pixel electrode PE1, and the second data line D2 may be another conductive line that is connected to another pixel electrode (not shown) spaced apart from the first pixel electrode PE1 in the first direction DR1.

As shown in FIG. 9A, positions where the first and second data lines D1 and D2 are overlapped with the first pixel electrode PE1 may be substantially the same as positions where the third and fourth data lines D3 and D4 are overlapped with the second pixel electrode PE2. In other words, the second data line D2 may be provided to be overlapped with the vertical line VL1 of the first pixel electrode PE1, and the first data line D1 may be provided at a left side of the second data line D2. The fourth data line D4 may be provided to be overlapped with the vertical line VL2 of the second pixel electrode PE2, and the third data line D3 may be provided at a left side of the fourth data line D4.

Alternatively, as shown in FIG. 9B, positions where the first and second data lines D1 and D2 are overlapped with the first pixel electrode PE1 may have mirror symmetry with respect to positions where the third and fourth data lines D3 and D4 are overlapped with the second pixel electrode PE2.

For example, the second data line D2 may be provided to be overlapped with the vertical line VL1 of the first pixel electrode PE1, and the first data line D1 may be provided at a left side of the second data line D2. By contrast, the third data line D3 may be provided to be overlapped with the vertical line VL2 of the second pixel electrode PE2, and the fourth data line D4 may be provided at a right side of the third data line D3.

The first data line D1 and the third data line D3 may be arranged in such a way that their positions are mirror-symmetric with respect to a center line extending in the first direction DR1. The second data line D2 and the fourth data line D4 may be arranged in such a way that their positions are mirror-symmetric with respect to a center line extending in the first direction DR1.

As shown in FIG. 9C, data lines D1, D2, D3, D4, D5, D6, D7, D8, D9, D10, D11, and D12, which are overlapped with six pixel electrodes PE1, PE2, PE3, PE4, PE5, and PE6 arranged in the second direction DR2, may be arranged to have mirror symmetry for each of colors of lights to be emitted through the pixel region. For example, the data lines D1 and D2, which are overlapped with the first pixel electrode PE1 displaying a red (R) color, and the data lines D7 and D8, which are overlapped with the fourth pixel electrode PE4 displaying the same red (R) color, may be arranged to have the mirror symmetry.

Furthermore, the data lines D3 and D4, which are overlapped with the second pixel electrode PE2 displaying a green (G) color, and the data lines D9 and D10, which are overlapped with the fifth pixel electrode PE5 displaying the same green (G) color, may be arranged to have the mirror symmetry.

Furthermore, the data lines D5 and D6, which are overlapped with the third pixel electrode PE3 displaying a blue (B) color, and the data lines D11 and D12, which are overlapped with the sixth pixel electrode PE6 displaying the same blue (B) color, may be arranged to have the mirror symmetry.

As seen in FIG. 9C, the first to third pixel electrodes PE1, PE2, and PE3 displaying the red (R), green (G), and blue (B) colors may be defined as one pixel group, and the fourth to sixth pixel electrodes PE4, PE5, and PE6 displaying the red (R), green (G), and blue (B) colors may be defined as another pixel group. In this case, two pixel groups may be respectively overlapped with data lines, which are arranged to have the mirror symmetry with respect to a center line defined between the third pixel electrode PE3 and the fourth pixel electrode PE4.

In the display panel according to some exemplary embodiments, locations overlapping the data line and the pixel electrode in adjacent pixels may be the same as each other, symmetric to each other, or asymmetric to each other. In the display panel according to some exemplary embodiments, for pixels that are located adjacent to each other or are used to display the same color, the arrangement of the data lines may be designed in the same or corresponding manner, and this may make it possible to improve color reproduction characteristics and to realize a high resolution display panel.

Figure 10:
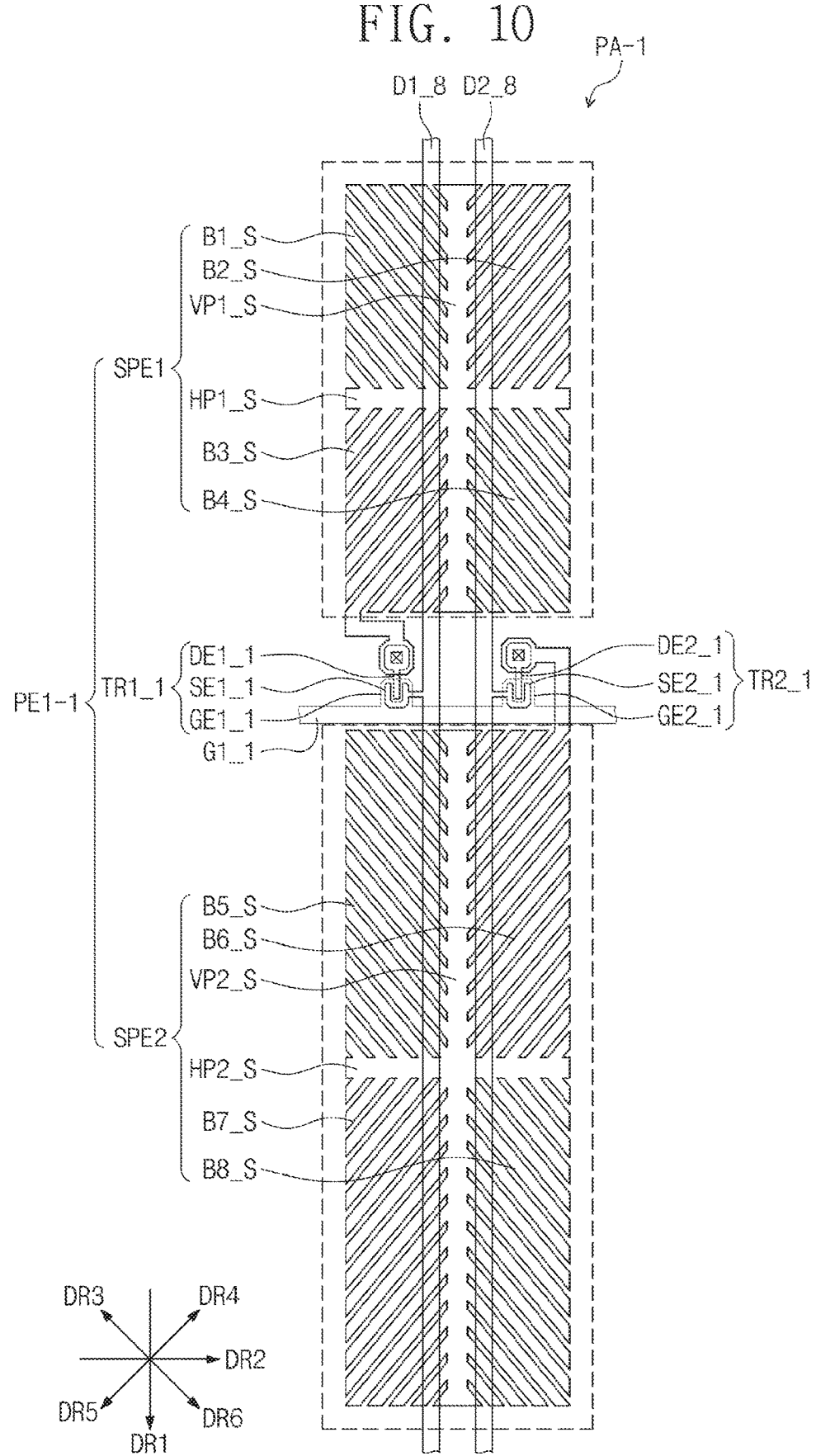
FIG. 10 is a plan view illustrating a portion of a display panel according to some exemplary embodiments.

FIG. 10 is a plan view illustrating a portion of a display panel according to some exemplary embodiments. For convenience in illustration, FIG. 10 illustrates a plan view illustrating a pixel region PA-1 in which a first pixel electrode PE1-1 is provided. Hereinafter, some exemplary embodiments will be described with reference to FIG. 10. For concise description, an element previously described with reference to FIGS. 1A to 9C may be identified by the same reference number without repeating an overlapping description thereof.

As shown in FIG. 10, a pixel may be provided in the pixel region PA-1. The pixel may include a plurality of thin-film transistors. For example, a first thin-film transistor TR1_1, a second thin-film transistor TR2_1, and a first pixel electrode PE1-1 may be provided in the pixel region PA-1.

The first thin-film transistor TR1_1 may include a first control electrode GE1_1, a first input electrode SE1_1, a first output electrode DE1_1, and a semiconductor pattern (not shown). The first thin-film transistor TR1_1 may be connected to a first gate line G1_1 and a first data line D1_8. The first control electrode GE1_1 may diverge (or extend) from the first gate line G1_1.

The second thin-film transistor TR2_1 may include a second control electrode GE2_1, a second input electrode SE2_1, a second output electrode DE2_1, and a semiconductor pattern (not shown). The second thin-film transistor TR2_1 may be connected to the first gate line G1_1 and a second data line D2_8. The second control electrode GE2_1 may diverge from the first gate line G1_1.

As seen in FIG. 10, the first thin-film transistor TR1_1 and the second thin-film transistor TR2_1 may be connected to the same gate line (e.g., G1_1) and may be connected to different data lines (e.g., D1_8 and D2_8). Thus, the pixel region PA-1 may be driven by one gate line G1_1 and two data lines D1_8 and D2_8.

The first pixel electrode PE1-1 may include a first sub-pixel electrode SPE1 and a second sub-pixel electrode SPE2. The first sub-pixel electrode SPE1 and the second sub-pixel electrode SPE2 may be spaced apart from each other in the first direction DR1. The first sub-pixel electrode SPE1 and the second sub-pixel electrode SPE2 may be spaced apart from each other in the first direction DR1, with the first thin-film transistor TR1_1 and the second thin-film transistor TR2_1 interposed therebetween, when viewed in a plan view.

The first sub-pixel electrode SPE1 may be connected to the first thin-film transistor TR1_1. The first sub-pixel electrode SPE1 may include a first sub-horizontal portion HP1_S, a first sub-vertical portion VP1_S, and a plurality of first branch portions B1_S, B2_S, B3_S, and B4_S. The first branch portions B1_S, B2_S, B3_S, and B4_S may include first to fourth sub-branch portions B1_S, B2_S, B3_S, and B4_S.

A shape of the first sub-pixel electrode SPE1 may be substantially the same as that of the first pixel electrode PE1 of FIG. 2. Thus, the shapes of the first sub-horizontal portion HP1_S, the first sub-vertical portion VP1_S, and the first branch portions B1_S, B2_S, B3_S, and B4_S may correspond to the shapes of the first horizontal portion HP1, the first vertical portion VP1, and the first to fourth branch portions B1, B2, B3, and B4 of the first pixel electrode PE1 (e.g., see FIG. 2). Hereinafter, description of overlapping elements previously described may be omitted.

The second sub-pixel electrode SPE2 may be connected to the second thin-film transistor TR2_1. The second sub-pixel electrode SPE2 may include a second sub-horizontal portion HP2_S, a second sub-vertical portion VP2_S, and a plurality of second branch portions B5_S, B6_S, B7_S, and B8_S. The second branch portions B5_S, B6_S, B7_S, and B8_S may include fifth to eighth sub-branch portions B5_S, B6_S, B7_S, and B8_S.

The second sub-pixel electrode SPE2 is illustrated to have a relatively large area, compared with the first sub-pixel electrode SPE1. In some exemplary embodiments, a shape of the second sub-pixel electrode SPE2 may be substantially the same as that of the first sub-pixel electrode SPE1. However, the inventive concepts are not limited thereto, and the shape of the second sub-pixel electrode SPE2 may be variously changed. Hereinafter, description of overlapping elements previously described may be omitted.

As shown in FIG. 10, each of the first sub-pixel electrode SPE1 and the second sub-pixel electrode SPE2 may be overlapped with two data lines D1_8 and D2_8, when viewed in a plan view. The first sub-pixel electrode SPE1 may be overlapped with both of the first and second data lines D1_8 driving the first and second sub-pixel electrodes SPE1 and SPE2, respectively, when viewed in a plan view. Furthermore, the second sub-pixel electrode SPE2 may be overlapped with both of the second and first data lines D2_8 and D1_8 driving the second and first sub-pixel electrodes SPE2 and SPE1, respectively, when viewed in a plan view. Accordingly, it may be possible to easily control a liquid crystal alignment angle for each of the sub-pixel electrodes SPE1 and SPE2 of the pixel electrode PE1-1, and overlap positions of the data lines D1_8 and D2_8 may be variously designed.

Figure 11A:
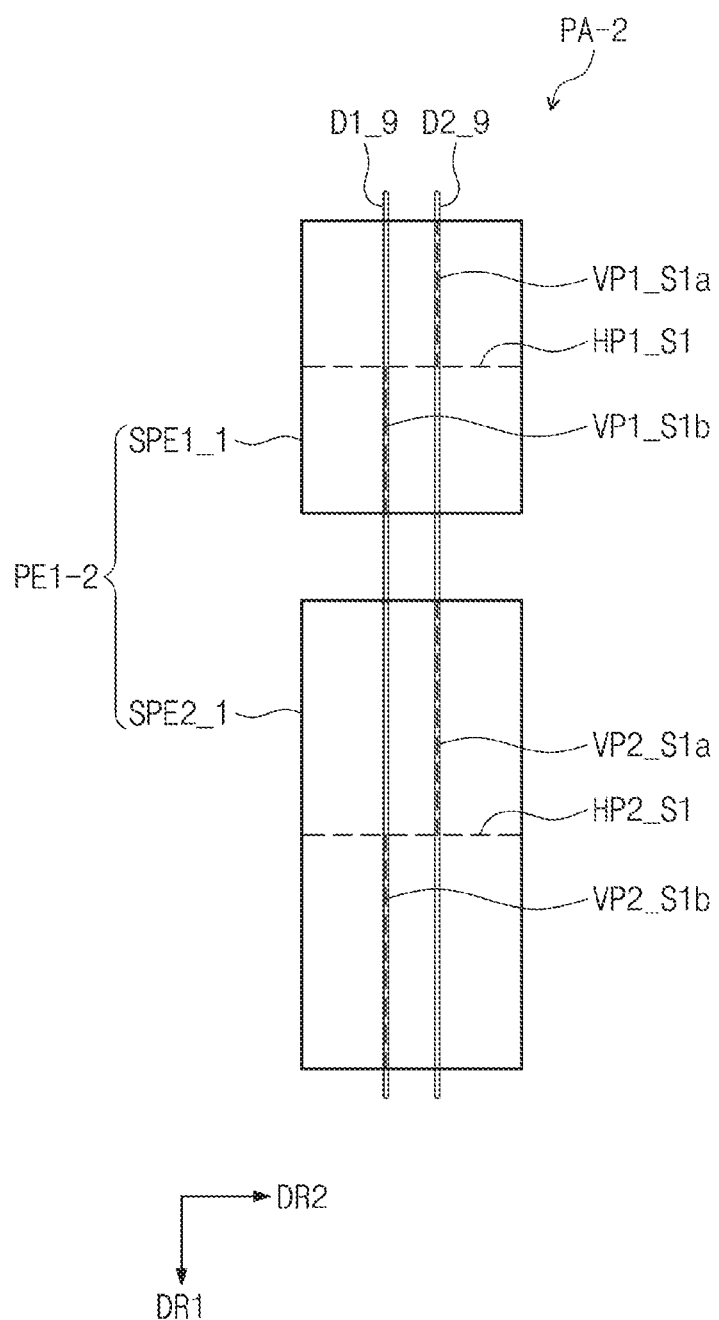
FIGS. 11A and 11B are plan views illustrating pixel regions according to some exemplary embodiments.
Figure 11B:
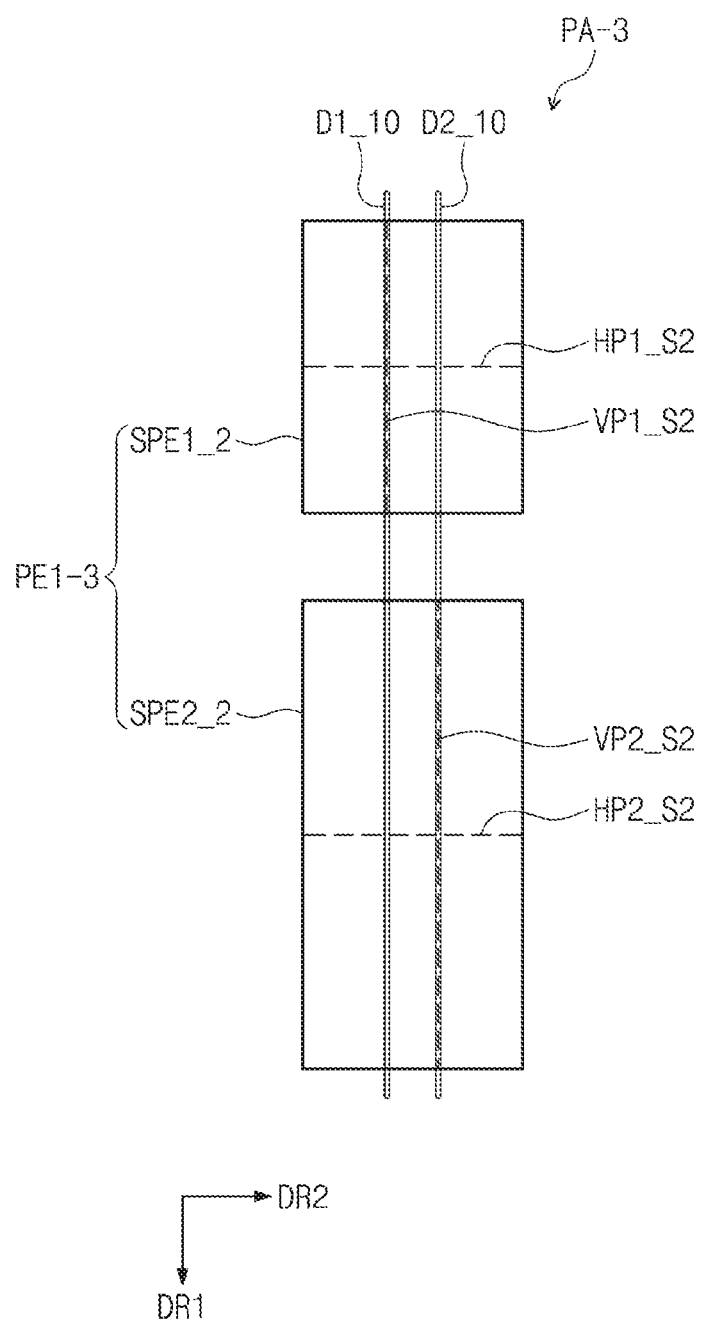

FIGS. 11A and 11B are plan views illustrating pixel regions according to some exemplary embodiments. For convenience in illustration, in FIGS. 11A and 11B, only the pixel electrode and the data lines are illustrated, and some elements are not illustrated or are illustrated as a dotted line. Pixel regions PA-2 and PA-3 shown in FIGS. 11A and 11B may correspond to the pixel region PA-1 shown in FIG. 10. Hereinafter, some exemplary embodiments will be described with reference to FIGS. 11A and 11B. For concise description, an element previously described with reference to FIGS. 1A to 10 may be identified by the same reference number without repeating an overlapping description thereof.

As shown in FIG. 11A, a pixel electrode PE1-2 and a plurality of data lines D1_9 and D2_9 may be provided on the pixel region PA-2, and here, the pixel electrode PE1-2 may include a first sub-pixel electrode SPE1_1 and a second sub-pixel electrode SPE2_1. As shown in FIG. 11A, the data lines D1_9 and D2_9 may have substantially the same shapes as those of the data lines D1_8 and D2_8 of FIG. 10.

Each of the first sub-pixel electrode SPE1_1 and the second sub-pixel electrode SPE2_1 may include a plurality of vertical portions spaced apart from each other in the second direction DR2. For example, the first sub-pixel electrode SPE1_1 may include a first sub-horizontal portion HP1_S1, a first vertical portion VP1_S1a, and a second vertical portion VP1_S1b.

The first vertical portion VP1_S1a may be provided in a region located above the first sub-horizontal portion HP1_S1 and may be connected to the first sub-horizontal portion HP1_S1. The second vertical portion VP1_S1b may be provided in a region located below the first sub-horizontal portion HP1_S1 and may be connected to the first sub-horizontal portion HP1_S1. The first vertical portion VP1_S1a and the second vertical portion VP1_S1b may not be overlapped with each other, when viewed in the first direction DR1.

Similarly, the second sub-pixel electrode SPE2_1 may include a second sub-horizontal portion HP2_S1, a third vertical portion VP2_S1a, and a fourth vertical portion VP2_S1b. The second sub-horizontal portion HP2_S1, the third vertical portion VP2_S1a, and the fourth vertical portion VP2_S1b may be provided to have substantially the same arrangement as that of the first sub-horizontal portion HP1_S1, the first vertical portion VP1_S1a, and the second vertical portion VP1_S1b of the first sub-pixel electrode SPE1_1.

The first data line D1_9 may be overlapped with the second vertical portion VP1_S1b and the fourth vertical portion VP2_S1b, when viewed in a plan view. The second data line D2_9 may be overlapped with the first vertical portion VP1_S1a and the third vertical portion VP2_S1a, when viewed in a plan view.

As shown in FIG. 11B, a pixel electrode PE1-3 and a plurality of data lines D1_10 and D2_10 may be provided on the pixel region PA-3, and here, the pixel electrode PE1-3 may include a first sub-pixel electrode SPE1_2 and a second sub-pixel electrode SPE2_2. As shown in FIG. 11B, the data lines D1_10 and D2_10 may have substantially the same shapes as those of the data lines D1_8 and D2_8 of FIG. 10.

Each of the first sub-pixel electrode SPE1_2 and the second sub-pixel electrode SPE2_2 may include sub-vertical portions, which are defined at different positions and are off-centered from a center of the pixel region PA-3.

For example, the first sub-pixel electrode SPE1_2 may include a first sub-horizontal portion HP1_S2 and a first sub-vertical portion VP1_S2. The first sub-vertical portion VP1_S2 may extend in a direction crossing the first sub-horizontal portion HP1_S2. The first sub-vertical portion VP1_S2 may be provided at a position that is shifted leftward from a center position of the first sub-horizontal portion HP1_S2.

The second sub-pixel electrode SPE2_2 may include a second sub-horizontal portion HP2_S2 and a second sub-vertical portion VP2_S2. The second sub-vertical portion VP2_S2 may extend in a direction crossing the second sub-horizontal portion HP2_S2. The second sub-vertical portion VP2_S2 may be provided at a position that is shifted rightward from a center position of the second sub-horizontal portion HP2_S2.

The first data line D1_10 may be overlapped with the first sub-vertical portion VP1_S2 of the first sub-pixel electrode SPE1_2 and may be spaced apart from the second sub-vertical portion VP2_S2 of the second sub-pixel electrode SPE2_2, when viewed in a plan view. The second data line D2_10 may be overlapped with the second sub-vertical portion VP2_S2 of the second sub-pixel electrode SPE2_2 and may be spaced apart from the first sub-vertical portion VP1_S2 of the first sub-pixel electrode SPE1_2, when viewed in a plan view.

In the display panel according to some exemplary embodiments, the pixel electrodes may be provided in various shapes, and shapes and positions of the data lines may be variously designed in accordance with the various shapes of the pixel electrodes. Accordingly, the pixel electrodes and the data lines may be easily overlapped with each other, when viewed in a plan view. Furthermore, the overlapping positions between the data lines and the pixel electrodes may be designed to be close to a center of the pixel electrodes, and this may make it possible to reduce a change in electrical and optical characteristics, which may be caused by the data lines at an edge region of the pixel region. Accordingly, it may be possible to improve display characteristics of a display panel and to easily realize a high resolution display panel.

Figure 12:
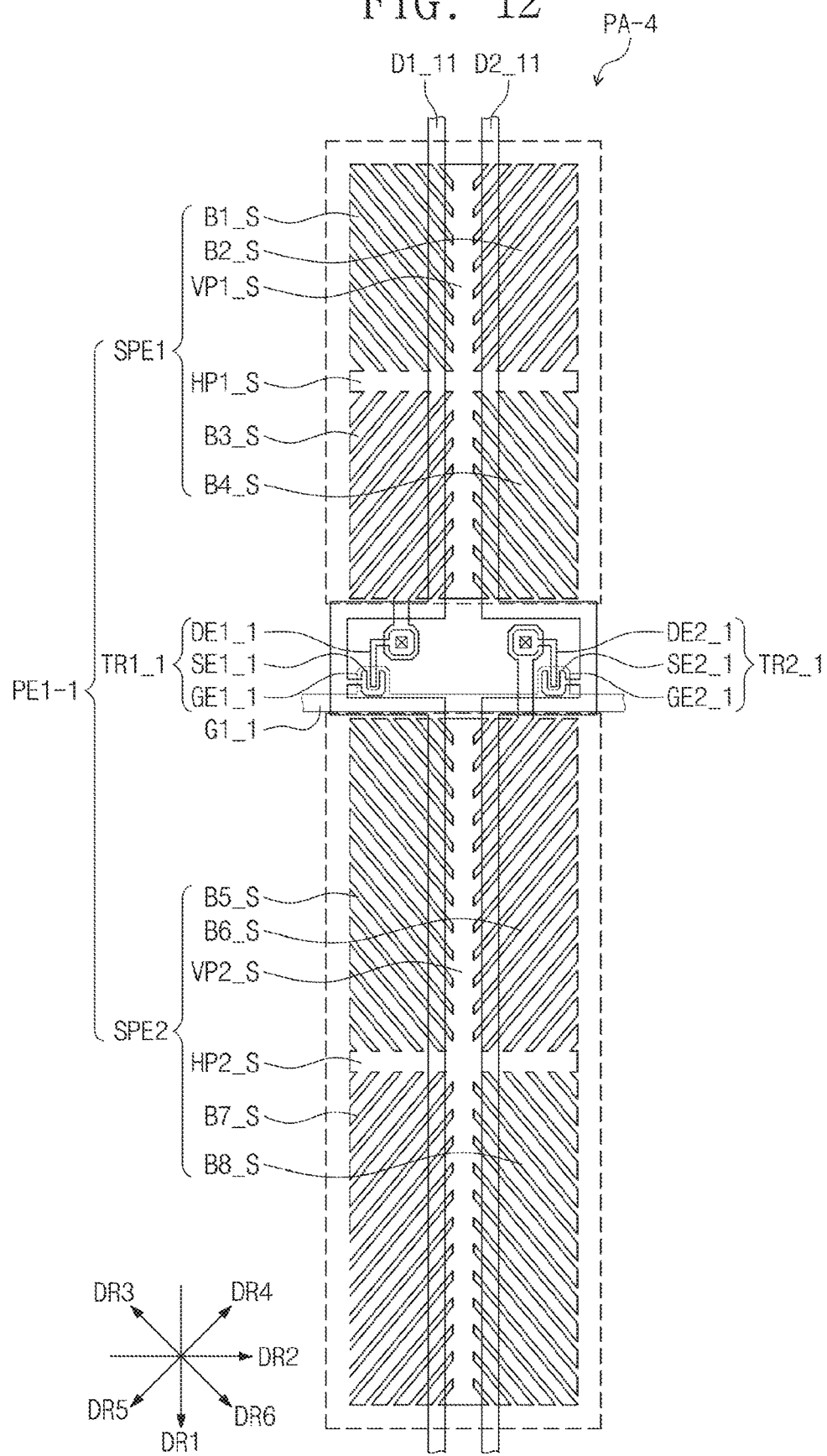
FIG. 12 is a plan view illustrating a portion of a display panel according to some exemplary embodiments.

FIG. 12 is a plan view illustrating a portion of a display panel according to some exemplary embodiments. For convenience in illustration, a plan view of a pixel region PA-4 provided with the pixel electrode PE1-1 is illustrated in FIG. 12, and the pixel electrode PE1-1 is illustrated to correspond to the pixel electrode PE1-1 of FIG. 10. Hereinafter, a display panel according to some exemplary embodiments will be described with reference to FIG. 12. For concise description, an element previously described with reference to FIGS. 1A to 11B may be identified by the same reference number without repeating an overlapping description thereof.

As shown in FIG. 12, each of a first data line D1_11 and a second data line D2_11 may include a bent portion, when viewed in the first direction DR1. For example, each of the first data line D1_11 and the second data line D2_11 may include at least a portion extending in the second direction DR2.

For example, the first data line D1_11 may include portions, which are located on the first sub-pixel electrode SPE1 and the second sub-pixel electrode SPE2 and extend in the first direction DR1, and portions, which are located on a region provided with the second thin-film transistor TR2_1 and protrude in a direction opposite to the second direction DR2 or extend parallel to the second direction DR2. Accordingly, the first data line D1_11 may include a bent portion, when viewed in the first direction DR1.

The second data line D2_11 may have a shape corresponding to the first data line D1_11. For example, the second data line D2_11 and the first data line D1_11 may be provided to have the mirror symmetry with respect to a center line extending in the first direction DR1. Accordingly, the first data line D1_11 and the second data line D2_11 may have bent portions that are symmetric to each other at a region where the first thin-film transistor TR1_1 and the second thin-film transistor TR2_1 are provided. However, the inventive concepts are not limited thereto, and in some exemplary embodiments, shapes of the data lines D1_11 and D2_11 of the display panel may be variously changed even if the data lines D1_11 and D2_11 are provided to be overlapped with the pixel electrode PE1-1, when viewed in a plan view.

According to some exemplary embodiments, in the pixel region PA-4, a shape of a portion corresponding to the non-transmission region may be changed, and thus, it may be possible to independently or freely design an overlapping structure between signal lines and a pixel electrode on the transmission region without dependence on various design structures of the non-transmission region. For example, the arrangement of the thin-film transistors TR1_2 and TR2_2 of FIG. 12 may be different from that of the thin-film transistors TR1_1 and TR2_1 of FIG. 10. However, the overlapping structure between the data lines D1_11 and D2_11 and the pixel electrode PE1-1 shown in FIG. 12 may correspond to that between the data lines D1_8 and D2_8 and the pixel electrode PE1-1 shown in FIG. 10. Since it is possible to easily control the arrangement design of the signal lines overlapped with the transmission region, it may be possible to improve a degree of freedom in the arrangement design of various electronic devices including the thin-film transistor provided on the non-transmission region.

According to some exemplary embodiments, it may be possible to prevent (or at least reduce) a transmittance property of a display panel from being deteriorated at an interface between pixel regions. Thus, it may be possible to realize the display panel having a wide viewing angle and improved lateral visibility.

According to some exemplary embodiments, it may be possible to increase an area of a pixel region and to reduce an area of a non-pixel region. Thus, it may be possible to easily realize a high resolution display panel.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display panel, comprising:
a first signal line extending in a first direction;
a second signal line extending in the first direction and spaced apart from the first signal line when viewed in a plan view;
a third signal line insulated from and crossing the first signal line and the second signal line, the third signal line extending in a second direction crossing the first direction;
a first thin-film transistor connected to the first signal line;
a second thin-film transistor connected to the second signal line; and
a first liquid crystal capacitor and a second liquid crystal capacitor arranged in the first direction and respectively connected to the first thin-film transistor and the second thin-film transistor,
wherein each of the first liquid crystal capacitor and the second liquid crystal capacitor comprises a pixel electrode, a common electrode, and a liquid crystal layer,
wherein each of the pixel electrodes of the first liquid crystal capacitor and the second liquid crystal capacitor comprises:
a vertical portion extending in the first direction;
a horizontal portion connected to the vertical portion, the horizontal portion extending in the second direction; and
a plurality of branch portions, each of which is connected to the horizontal portion or the vertical portion, the plurality of branch portions extending in a direction crossing the horizontal portion and the vertical portion, and
wherein each of the first signal line and the second signal line overlaps, when viewed in a plan view, the pixel electrode of the first liquid crystal capacitor and is disposed closer to the vertical portion than to an outer edge of the pixel electrode of the first liquid crystal capacitor in the second direction.

2. The display panel of claim 1, wherein:
the horizontal portion comprises one end and an opposite end; and
the first signal line and the second signal line are disposed within a region defined between a first midpoint and a second midpoint, the first midpoint being between the one end of the horizontal portion and the vertical portion, the second midpoint being between the opposite end of the horizontal portion and the vertical portion.

3. The display panel of claim 2, wherein, when viewed in a plan view, at least one of the first signal line and the second signal line overlaps the horizontal portion.

4. The display panel of claim 2, wherein the first signal line and second signal line are spaced apart from each other in the first direction, the horizontal portion being interposed between the first signal line and the second signal line.

5. The display panel of claim 4, further comprising:
a light-blocking pattern overlapping the horizontal portion and extending in the first direction,
wherein the light-blocking pattern is spaced apart from each of the first signal line and the second signal line in the second direction.

6. The display panel of claim 2, wherein the vertical portion is connected to the horizontal portion and crosses a midpoint of the horizontal portion.

7. The display panel of claim 2, wherein:
the vertical portion is spaced apart from a midpoint of the horizontal portion in the second direction; and
when viewed in a plan view, at least one of the first signal line and the second signal line overlaps the vertical portion.

8. The display panel of claim 2, wherein:
the vertical portion comprises a first portion and a second portion that are divided by the horizontal portion; and
the first portion and the second portion are spaced apart from each other in the second direction.

9. The display panel of claim 8, wherein:
the first signal line overlaps one of the first portion and the second portion; and
the second signal line overlaps the other of the first portion and the second portion.

10. The display panel of claim 8, wherein:
one of the first signal line and the second signal line extends along each of the first portion, a horizontal portion connecting the first portion to the second portion, and the second portion; and
when viewed in a plan view, the other of the first signal line and the second signal line is spaced apart from the vertical portion.

11. The display panel of claim 1, wherein:
each of the pixel electrodes of the first liquid crystal capacitor and the second liquid crystal capacitor further comprises:
a first edge portion connected to one end of the horizontal portion, the first edge portion extending in the first direction; and
a second edge portion connected to an opposite end of the horizontal portion, the second edge portion extending in the first direction; and
when viewed in a plan view, each of the first signal line and the second signal line is spaced apart from the first edge portion and the second edge portion.

12. The display panel of claim 1, wherein, when viewed in a plan view, the vertical portions of the pixel electrodes of the first liquid crystal capacitor and the second liquid crystal capacitor do not overlap each other in the first direction.

13. The display panel of claim 1, wherein each of the first signal line and the second signal line further comprises a portion extending in the second direction.

14. The display panel of claim 13, wherein the first thin-film transistor and the second thin-film transistor are disposed between the first signal line and the second signal line.

15. The display panel of claim 1, further comprising:
a fourth signal line spaced apart from the third signal line when viewed in a plan view, the fourth signal line and the third signal line extending in the second direction and crossing the first signal line and the second signal line, the fourth signal line and the third signal line being electrically disconnected from the first signal line and the second signal line,
wherein:
the first thin-film transistor is connected to the third signal line; and
the second thin-film transistor is connected to the fourth signal line.

16. The display panel of claim 1, wherein the first thin-film transistor and the second thin-film transistor are connected to the third signal line.

17. A display panel, comprising:
a first signal line and a second signal line that extend in a first direction and are spaced apart from each other in a second direction crossing the first direction;
a third signal and a fourth signal line that extend in the second direction and cross the first signal line and the second signal line, the third signal line and the fourth signal line being insulated from the first signal line and the second signal line;
a first thin-film transistor connected to the first signal line and the third signal line;
a second thin-film transistor connected to the second signal line and the fourth signal line;
a first pixel electrode connected to the first thin-film transistor, the first pixel electrode overlapping, when viewed in a plan view, the first signal line and the second signal line; and
a second pixel electrode connected to the second thin-film transistor, the second pixel electrode overlapping, when viewed in a plan view, the first signal line and the second signal line,
wherein each of the first pixel electrode and the second pixel electrode comprises:
a vertical portion extending in the first direction;
a horizontal portion extending in the second direction and connected to the vertical portion; and
a plurality of branch portions, each of which is connected to the vertical portion or the horizontal portion, the plurality of branch portions extending in a direction crossing the first direction and the second direction; and
wherein, when viewed in the plan view, at least one of the first signal line and the second signal line overlaps the vertical portion.

18. The display panel of claim 17, wherein:
the horizontal portion comprises one end and an opposite end spaced apart from each other in the second direction; and
the first signal line and the second signal line are disposed between two midpoints, a first midpoint of the midpoints being disposed between the vertical portion and the one end of the horizontal portion, and a second midpoint of the midpoints being disposed between the vertical portion and the opposite end of the horizontal portion.

19. The display panel of claim 18, wherein:

the vertical portion comprises a first portion and a second portion spaced apart from each other in the second direction, the horizontal portion being interposed between the first portion and the second portion;

one of the first signal line and the second signal line overlaps the first portion; and the other of the first signal line and the second signal line overlaps the second portion.

20. The display panel of claim 18, wherein:

the vertical portion comprises a first portion and a second portion arranged in the first direction, the horizontal portion being interposed between the first portion and the second portion;

one of the first signal line and the second signal line overlaps the first portion and the second portion; and the other of the first signal line and the second signal line is spaced apart from the vertical portion in the second direction.

* * * * *